(12) United States Patent
Yoshikawa

(10) Patent No.: US 11,482,637 B2
(45) Date of Patent: Oct. 25, 2022

(54) PHOTOELECTRIC CONVERSION ELEMENT AND PHOTOELECTRIC CONVERSION DEVICE

(71) Applicant: KANEKA CORPORATION, Osaka (JP)

(72) Inventor: Kunta Yoshikawa, Settsu (JP)

(73) Assignee: KANEKA CORPORATION, Osaka (JP)

( * ) Notice: Subject to any disclaimer, the term of this patent is extended or adjusted under 35 U.S.C. 154(b) by 416 days.

(21) Appl. No.: 16/809,526

(22) Filed: Mar. 4, 2020

(65) Prior Publication Data

US 2020/0203552 A1 Jun. 25, 2020

Related U.S. Application Data

(63) Continuation of application No. PCT/JP2018/035031, filed on Sep. 21, 2018.

(30) Foreign Application Priority Data

Nov. 15, 2017 (JP) .............................. JP2017-220401

(51) Int. Cl.
*H01L 31/16* (2006.01)
*H01L 31/10* (2006.01)
(Continued)

(52) U.S. Cl.
CPC ...... *H01L 31/16* (2013.01); *H01L 31/022466* (2013.01); *H01L 31/0543* (2014.12); *H01L 31/10* (2013.01); *H01L 31/1868* (2013.01)

(58) Field of Classification Search
CPC ............. H01L 31/16; H01L 31/022466; H01L 31/0543; H01L 31/10; H01L 31/1868
(Continued)

(56) References Cited

U.S. PATENT DOCUMENTS 4,366,377 A 12/1982 Notthoff et al.
5,841,465 A 11/1998 Fukunaga et al.
(Continued)

FOREIGN PATENT DOCUMENTS

JP S54-118837 A 9/1979
JP S64-001286 A 1/1989
(Continued)

OTHER PUBLICATIONS

International Search Report issued in PCT/JP2018/035031; dated Nov. 6, 2018.

*Primary Examiner* — David Vu
*Assistant Examiner* — Brandon C Fox
(74) *Attorney, Agent, or Firm* — Studebaker & Brackett PC

(57) ABSTRACT

A photoelectric conversion element for detecting the spot size of incident light, including a photoelectric conversion substrate provided with two main surfaces, and multiple first sensitivity sections and second sensitivity sections arranged in a prescribed direction. When sensitivity regions on the respective main surfaces of the multiple first sensitivity sections are defined as first sensitivity regions, and sensitivity regions that appear on the main surfaces of the second sensitivity sections are defined as second sensitivity regions, each of the first sensitivity regions receives at least a part of light incident on the main surfaces, and has a pattern in which, in accordance with enlargement of an irradiation region irradiated with incident light on the main surface, the proportion of the first sensitivity regions in the irradiation region with respect to the first sensitivity regions other than those in the irradiation region and the second sensitivity regions is decreased.

20 Claims, 12 Drawing Sheets

(51) Int. Cl.
*H01L 31/054* (2014.01)
*H01L 31/0224* (2006.01)
*H01L 31/18* (2006.01)

(58) Field of Classification Search
USPC .......................................................... 257/431
See application file for complete search history.

(56) References Cited

U.S. PATENT DOCUMENTS

2014/0043522 A1\* 2/2014 Hamano ............ H04N 5/23219
348/349
2021/0015437 A1\* 1/2021 Tanabe ................... A61B 6/484

FOREIGN PATENT DOCUMENTS

| | | |
|---|---|---|
| JP | H08-018091 A | 1/1996 |
| JP | H09-096505 A | 4/1997 |
| JP | H10-111365 A | 4/1998 |
| JP | 2006-343298 A | 12/2006 |
| JP | 2007-282028 A | 10/2007 |
| JP | 6093061 B2 | 3/2017 |

\* cited by examiner

PHOTOELECTRIC CONVERSION ELEMENT AND PHOTOELECTRIC CONVERSION DEVICE

CROSS-REFERENCE TO RELATED APPLICATIONS

This application claims benefit of priority to International Patent Application No. PCT/JP2018/035031, filed Sep. 21, 2018, and to Japanese Patent Application No. 2017-220401, filed Nov. 15, 2017, the entire contents of each are incorporated herein by reference.

BACKGROUND

Technical Field

The present disclosure relates to a photoelectric conversion element and a photoelectric conversion device used in the field of light detection or the like.

Background Art

Japanese Patent No. 6093061 discloses a photoelectric conversion element (semiconductor light receiving element) for detecting the intensity (illuminance) of incident light. An element using a crystalline silicon substrate is, for example, known as such a photoelectric conversion element. In the photoelectric conversion element using the crystalline silicon substrate, a dark current is relatively small and an S/N ratio is relatively high and sensitivity is high (stable response without depending on illuminance) even if the intensity of incident light is low.

SUMMARY

There is a demand for a photoelectric conversion element capable of detecting the spot size of incident light.

Accordingly, the present disclosure provides a photoelectric conversion element and a photoelectric conversion device for detecting the spot size of incident light.

A photoelectric conversion element according to the present disclosure is a photoelectric conversion element including a photoelectric conversion substrate having two principal surfaces, and includes a plurality of first sensitive parts arrayed in a predetermined direction and a second sensitive part. When a sensitive region appearing on the principal surface of each of the plurality of first sensitive parts is defined as a first sensitive region and a sensitive region appearing on the principal surface of the second sensitive part is defined as a second sensitive region, each of the first sensitive regions receives at least a portion of incident light incident on the principal surface and forms a pattern for decreasing a ratio, in an irradiation region, of the own first sensitive region to the first sensitive regions other than the own first sensitive region and the second sensitive region as the irradiation region irradiated with the incident light on the principal surface increases.

A photoelectric conversion device according to the present disclosure includes a first photoelectric conversion element arranged on an upstream side of incident light and the above photoelectric conversion element arranged on a downstream side of the incident light and serving as a second photoelectric conversion element. The photoelectric conversion device according to the present disclosure includes an optical lens arranged on an upstream side of incident light and the above photoelectric conversion element arranged on a downstream side of the incident light.

According to the present disclosure, it is possible to provide a photoelectric conversion element and a photoelectric conversion device for detecting the spot size of incident light.

DETAILED DESCRIPTION

Embodiments of the present disclosure will be described with reference to the accompanying drawings below. Same or corresponding parts shall be denoted by the same reference numbers in each drawing. For the sake of convenience, hatching, member reference numbers, etc. may be omitted. However, in such cases, other drawings shall be referred to.

First Embodiment

Figure 1:
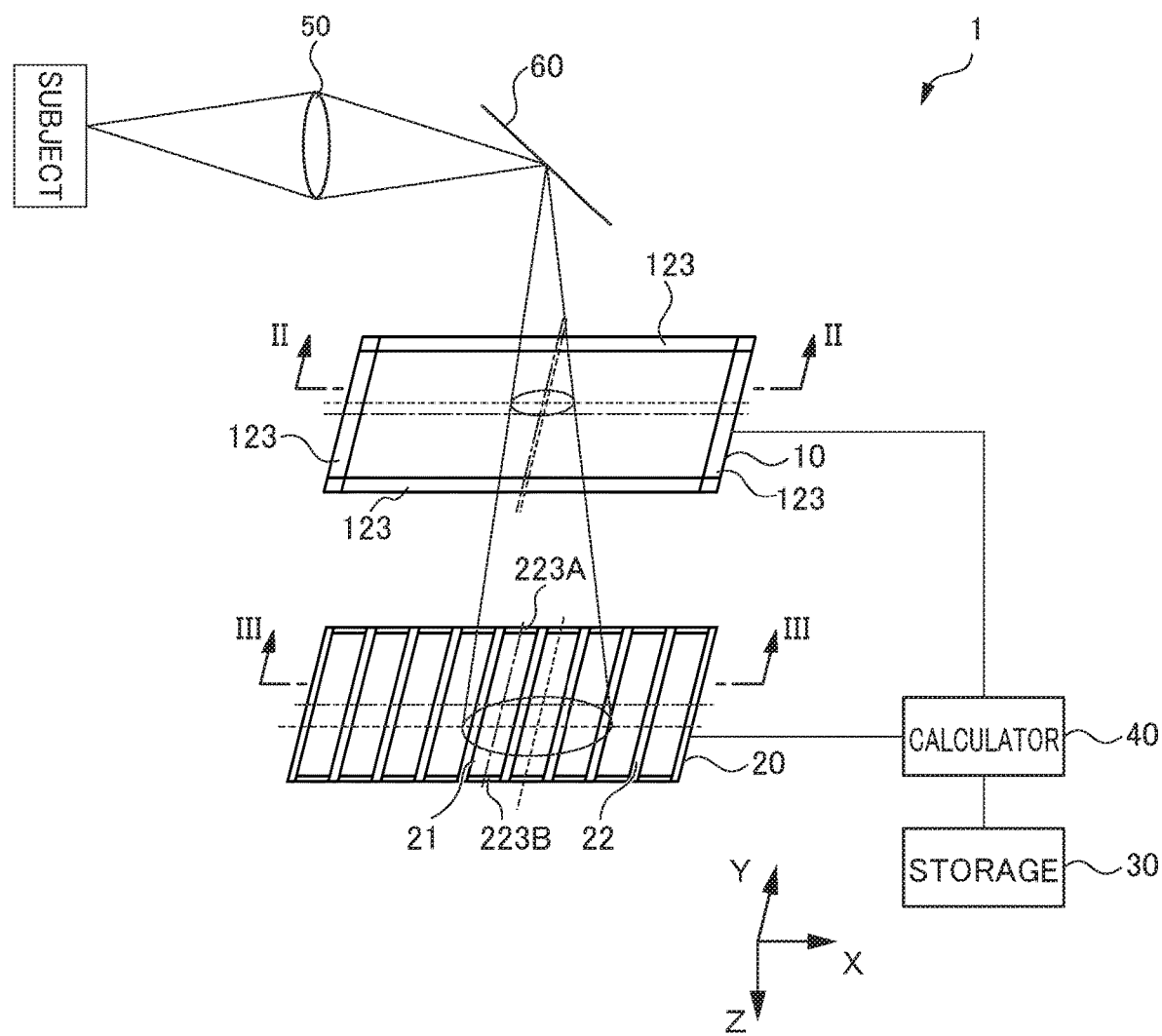
FIG. 1 is a view showing the configuration of a photoelectric conversion device (three-dimensional sensor) according to a first embodiment.

FIG. 1 is a view showing the configuration of a photoelectric conversion device according to a first embodiment. The photoelectric conversion device 1 shown in FIG. 1 includes an optical lens 50 for condensing an optical image (diffused light) emitted from a subject, for example, by irradiating laser light to the subject, and a mirror 60 for changing the direction of condensed light from the optical lens 50. The photoelectric conversion device 1 includes a first photoelectric conversion element 10 arranged on an upstream side in a light propagation direction from the mirror 60, a second photoelectric conversion element 20 arranged on a downstream side in the light propagation direction, a storage 30 and a calculator 40.

An XYZ orthogonal coordinate system is shown in FIG. 1 and figures to be described later. An XY plane is a plane parallel to light receiving surfaces of the first photoelectric conversion element 10 and the second photoelectric conversion element 20 (and a photoelectric conversion element 20A according to a second embodiment) and a Z direction is a direction orthogonal to the XY plane.

In FIG. 1 and the figures to be described later, an intersection of two dashed-dotted lines in a plan view indicates a center of the XY plane; one dashed-dotted line is parallel to an X direction and the other dashed-dotted line is parallel to a Y direction. An intersection of two dotted lines in the plan view indicates a center of the spot size of incident light on the XY plane; one dotted line is parallel to the X direction and the other dotted line is parallel to the Y direction.

The photoelectric conversion device 1 shown in FIG. 1 has a function for detecting the spot size of incident light, and is suitably applicable to an optical sensor such as a three-dimensional sensor. For example, the three-dimensional sensor detects a position in a Z direction (depth) (i.e. a distance in the Z direction) in addition to positions in X and Y directions (XY position) of a subject by causing diffused light from the subject to be incident thereon. In such a three-dimensional sensor, if the position of the subject in the Z direction (depth) changes, the spot size of incident light incident on a photoelectric conversion element inside changes (defocusing). Accordingly, if the photoelectric conversion device 1 according to this embodiment is applied to such a three-dimensional sensor, the position (a distance in the Z direction) of the subject in the Z direction (depth) can be detected by detecting the spot size of incident light incident on the photoelectric conversion element. The three-dimensional position of the subject can be detected from the XY position of the subject (or an incident direction of the incident light) and the position (a distance in the Z direction) in the Z direction (depth). Each component of the photoelectric conversion device 1 is described below.

The first photoelectric conversion element 10 generates a current corresponding to the intensity (total amount) of incident light incident on the light receiving surface. The first photoelectric conversion element 10 distributes and outputs the generated current to four electrode layers 123 (and electrode layers 133 on a back surface side to be described later) arranged on four sides according to a center position (coordinates) (hereinafter, also referred to as an XY position) of the incident light on the light receiving surface (XY plane). The first photoelectric conversion element 10 also transmits the incident light. The configuration of the first photoelectric conversion element 10 is described in detail later.

The second photoelectric conversion element 20 generates a current corresponding to the intensity of the incident light incident on each of a plurality of high-sensitive parts 21 (to be described in detail later). In this way, the second photoelectric conversion element 20 generates a current corresponding to the density of the incident light, i.e. a current corresponding to the spot size of the incident light (to be described in detail later). The second photoelectric conversion element 20 distributes and outputs the generated current to a plurality of electrode layers 223A (and a plurality of electrode layers 233A on a back surface side to be described later) arranged on one of the two opposite sides, and a plurality of electrode layers 223B (and a plurality of electrode layers 233B on a back surface side to be described later) arranged on the other side, according to a center position (coordinates) (hereinafter, also referred to as an XY position) of the incident light on the light receiving surface (XY plane). The configuration of the second photoelectric conversion element 20 is described in detail later.

The storage 30 stores in advance a table associating an output current (total amount) of the first photoelectric conversion element 10 (i.e. the intensity (total amount) of incident light on the first photoelectric conversion element 10) and an output current (total amount) of the second photoelectric conversion element 20 (i.e. the intensity of the incident light on the high-sensitive part of the second photoelectric conversion element 20) with the spot size of the incident light on the light receiving surface of the second photoelectric conversion element 20, and further associating the position (i.e. a distance in the Z direction) of the subject in the Z direction (depth) with this spot size. The storage 30 is a rewritable memory such as an EEPROM.

The calculator 40 calculates and detects the intensity (total amount) of the incident light according to the total amount of currents output from the four electrode layers 123 (133) of the first photoelectric conversion element 10.

The calculator 40 also calculates and detects the XY position (coordinates) of the incident light on the light receiving surface of the first photoelectric conversion element 10 based on a ratio of the currents output from each of the four electrode layers 123 (133) of the first photoelectric conversion element 10. The calculator 40 also calculates and detects the XY position (coordinates) of the incident light on the light receiving surface of the second photoelectric conversion element 20 based on a distribution and ratio of the currents output from the plurality of electrode layers 223A (233A) and the plurality of electrode layers 223B (233B) of the second photoelectric conversion element 20. The calculator 40 calculates and detects an incident direction of the incident light from the XY position (coordinates) of the incident light on the light receiving surface of the first photoelectric conversion element 10 and the XY position (coordinates) of the incident light on the light receiving surface of the second photoelectric conversion element 20.

The calculator 40 also refers to the table stored in the storage 30 and obtains and detects the spot size of the incident light on the light receiving surface of the second photoelectric conversion element 20 corresponding to the total amount of the currents output from the four electrode layers 123 (133) of the first photoelectric conversion element 10 (i.e. the intensity (total amount) of the incident light on the first photoelectric conversion element 10) and the sum of the currents output from the electrode layers 223A (233A) and the electrode layers 223B (233B) of any of the high-sensitive parts 21 of the second photoelectric conversion element 20 (i.e. the intensity of the incident light on the high-sensitive part of the second photoelectric conversion element 20), and the position (i.e. a distance in the Z direction) of the subject in the Z direction (depth). The calculator 40 detects the three-dimensional position of the subject from the incident direction of the incident light detected as described above and the position (i.e. a distance in the Z direction) in the Z direction (depth). The function and operation of the calculator 40 will be described in detail later.

The calculator 40 is constituted by an arithmetic processor such as a DSP (Digital Signal Processor) or an FPGA (Field-Programmable Gate Array). Various functions of the calculator 40 are realized, for example, by executing a predetermined software (program, application) stored in the storage 30. Various functions of the calculator 40 may be realized by the cooperation of a hardware and a software or may be realized only by a hardware (electronic circuit). The configurations of the first photoelectric conversion element 10 and the second photoelectric conversion element 20, and the function and operation of the calculator 40 are described in detail below in order.

<Configuration of First Photoelectric Conversion Element>

Figure 2:
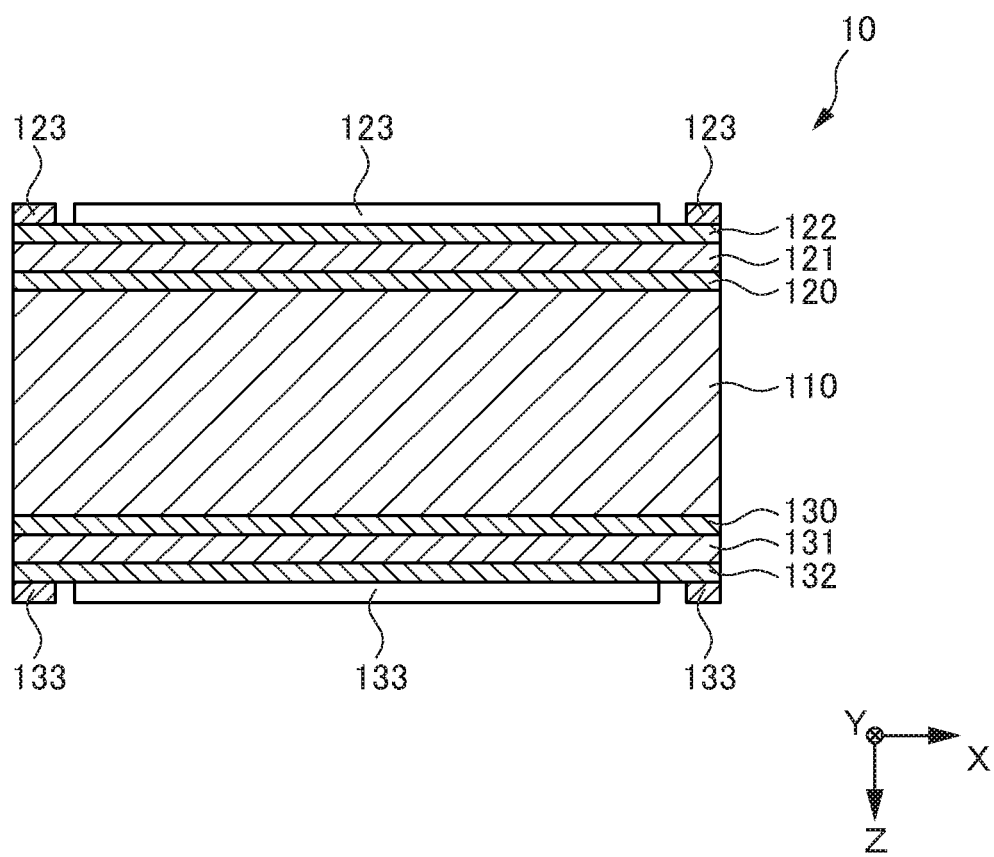
FIG. 2 is a sectional view along line II-II in a first photoelectric conversion element of FIG. 1.

FIG. 2 is a sectional view along line II-II of the first photoelectric conversion element 10 of FIG. 1. The first photoelectric conversion element 10 is provided with an n-type (second conductivity type) semiconductor substrate (photoelectric conversion substrate) 110 having two principal surfaces, and a passivation layer 120, a p-type (first conductivity type) semiconductor layer 121, a transparent electrode layer 122 and the electrode layers 123 successively laminated on the light receiving surface side, which is one principal surface on a light receiving side, out of the principal surfaces of the semiconductor substrate 110. The first photoelectric conversion element 10 is also provided with a passivation layer 130, an n-type (second conductivity type) semiconductor layer 131, a transparent electrode layer 132 and the electrode layers 133 successively laminated on a part of a back surface side, which is the other principal surface on a side opposite to the light receiving side, out of the principal surfaces of the semiconductor substrate 110.

The semiconductor substrate (photoelectric conversion substrate) 110 is formed of a crystalline silicon material such as single-crystal silicon or multi-crystal silicon. The semiconductor substrate 110 is, for example, an n-type semiconductor substrate in which the crystalline silicon material is doped with an n-type dopant. An example of the n-type dopant may include phosphorus (P). By using the crystalline silicon as the material of the semiconductor substrate 110, a dark current is relatively small, and an S/N ratio is relatively high and sensitivity is high (stable response without depending on illuminance) even if the intensity of the incident light is low.

The passivation layer 120 is formed on the light receiving surface side of the semiconductor substrate 110, and the passivation layer 130 is formed on the back surface side of the semiconductor substrate 110. The passivation layers 120, 130 are, for example, formed of an intrinsic (i-type) amorphous silicon material. The passivation layers 120, 130 suppress the recombination of carriers generated in the semiconductor substrate 210 and enhance carrier recovery efficiency.

The p-type semiconductor layer 121 is formed on the passivation layer 120. The p-type semiconductor layer 121 is, for example, formed of an amorphous silicon material. The p-type semiconductor layer 121 is, for example, a p-type semiconductor layer in which the amorphous silicon material is doped with a p-type dopant. An example of the p-type dopant may include boron (B).

The n-type semiconductor layer 131 is formed on the passivation layer 130. The n-type semiconductor layer 131 is, for example, formed of an amorphous silicon material. The n-type semiconductor layer 131 is, for example, an n-type semiconductor layer in which the amorphous silicon material is doped with an n-type dopant (e.g. phosphorus (P) described above). The aforementioned passivation layers 120, 130, p-type semiconductor layer 121 and n-type semiconductor layer 131 are formed, for example, using a CVD method.

The transparent electrode layer 122 is formed on the p-type semiconductor layer 121, and the transparent electrode layer 132 is formed on the n-type semiconductor layer 131. The transparent electrode layers 122, 132 are formed of a transparent conductive material. ITO (Indium Tin Oxide: complex oxide of indium oxide and tin oxide) or the like is given as an example of the transparent conductive material. The transparent electrode layers 122, 132 are formed, for example, using a sputtering method.

Four electrode layers 123 are independently formed on the respective four sides on the transparent electrode layer 122, and four electrode layers 133 are independently formed on the respective four sides on the transparent electrode layer 132. The electrode layers 123, 133 are formed of a conductive paste material containing metal powder such as silver powder. The electrode layers 123, 133 are formed, for example, using a printing method.

<Configuration of Second Photoelectric Conversion Element>

Figure 3:
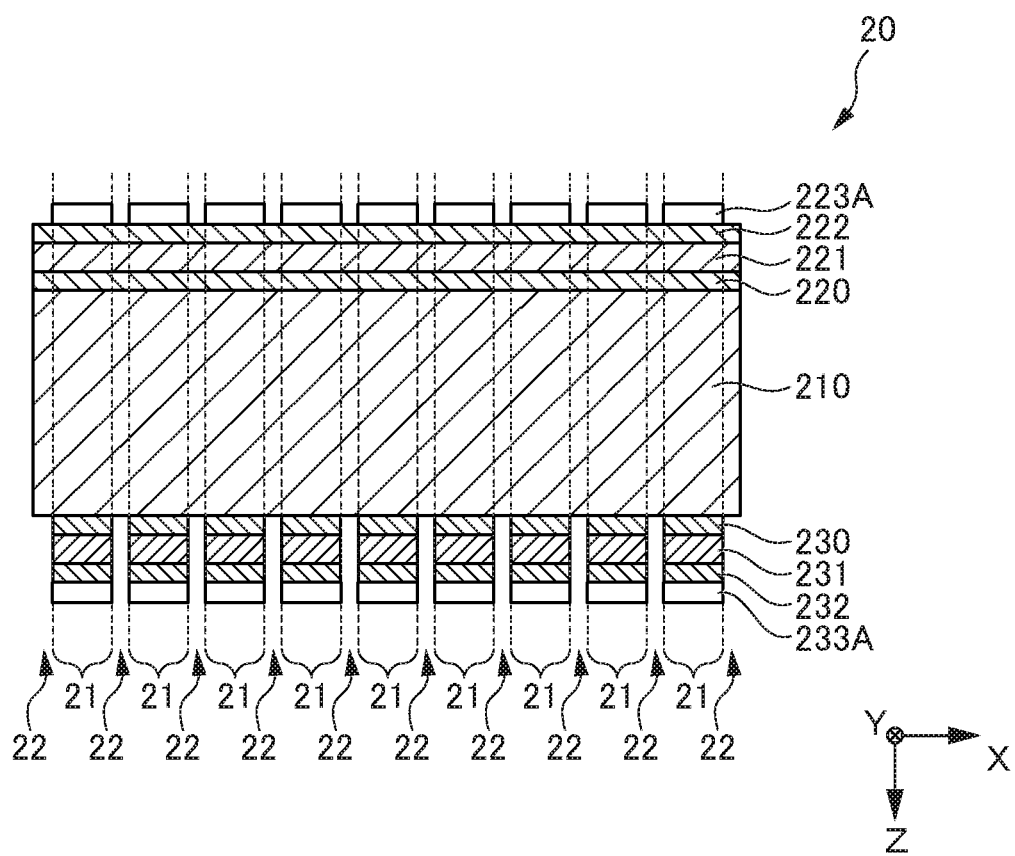
FIG. 3 is a sectional view along line in a second photoelectric conversion element of FIG. 1.

FIG. 3 is a sectional view along line of the second photoelectric conversion element 20 of FIG. 1. The second photoelectric conversion element 20 is provided with an n-type (second conductivity type) semiconductor substrate (photoelectric conversion substrate) 210 having two principal surfaces, and a passivation layer 220, a p-type (first conductivity type) semiconductor layer 221, a transparent electrode layer 222 and the electrode layers 223A, 223B successively laminated on the light receiving surface side, which is one principal surface on a light receiving side, out of the principal surfaces of the semiconductor substrate 210. The second photoelectric conversion element 20 is also provided with a passivation layer 230, an n-type (second conductivity type) semiconductor layer 231, a transparent electrode layer 232 and the electrode layers 233A, 233B successively laminated in a specific region on a back surface side, which is the other principal surface on a side opposite to the light receiving surface, out of the principal surfaces of the semiconductor substrate 210.

A laminated part in this specific region, i.e. a laminated part formed by the transparent electrode layer 232, the n-type semiconductor layer 231, the passivation layer 230, the semiconductor substrate 210, the passivation layer 220, the p-type semiconductor layer 221 and the transparent electrode layer 222 is referred to as a high-sensitive part 21, and laminated parts other than in the specific region are referred to as low-sensitive parts 22.

The semiconductor substrate (photoelectric conversion substrate) 210 is formed of a crystalline silicon material such as single-crystal silicon or multi-crystal silicon similarly to the semiconductor substrate 110 of the aforementioned first photoelectric conversion element 10. The semiconductor substrate 210 is, for example, an n-type semiconductor substrate in which the crystalline silicon material is doped with an n-type dopant (e.g. phosphorus (P) described above). By using the crystalline silicon as the material of the semiconductor substrate 210, a dark current is relatively small, and an S/N ratio is relatively high and sensitivity is high (stable response without depending on illuminance) even if the intensity of the incident light is low.

The passivation layer 220 is formed in both the high-sensitive part 21 and the low-sensitive parts 22 on the light receiving surface side of the semiconductor substrate 210, and the passivation layer 230 is formed only in the high-sensitive part 21 on the back surface side of the semiconductor substrate 210. The passivation layers 220, 230 are, for example, formed of an intrinsic (i-type) amorphous silicon material similarly to the passivation layers 120, 130 of the aforementioned first photoelectric conversion element 10. The passivation layers 220, 230 suppress the recombination of carriers generated in the high-sensitive part 21 of the semiconductor substrate 210 and enhance carrier recovery efficiency.

The p-type semiconductor layer 221 is formed on the passivation layer 220, i.e. in both the high-sensitive part 21 and the low-sensitive parts 22 on the light receiving surface side of the semiconductor substrate 210. The p-type semiconductor layer 221 is, for example, formed of an amorphous silicon material similarly to the p-type semiconductor layer 121 of the aforementioned first photoelectric conversion element 10. The p-type semiconductor layer 221 is, for example, a p-type semiconductor layer in which the amorphous silicon material is doped with a p-type dopant (e.g. boron (B) described above).

The n-type semiconductor layer 231 is formed on the passivation layer 230, i.e. only in the high-sensitive part 21 on the back surface side of the semiconductor layer 210. The n-type semiconductor layer 231 is, for example, formed of an amorphous silicon material similarly to the n-type semiconductor layer 131 of the aforementioned first photoelectric conversion element 10. The n-type semiconductor layer 231 is, for example, an n-type semiconductor layer in which the amorphous silicon material is doped with an n-type dopant (e.g. phosphorus (P) described above). The aforementioned passivation layers 220, 230, p-type semiconductor layer 221 and n-type semiconductor layer 231 are formed, for example, using a CVD method.

The transparent electrode layer 222 is formed on the p-type semiconductor layer 221, i.e. in both the high-sensitive part 21 and the low-sensitive parts 22 on the light receiving surface side of the semiconductor substrate 210, and the transparent electrode layer 232 is formed on the n-type semiconductor layer 231, i.e. only in the high-sensitive part 21 on the back surface side of the semiconductor substrate 210. The transparent electrode layers 222, 232 are formed of a transparent conductive material similarly to the transparent electrode layers 122, 132 of the aforementioned first photoelectric conversion element 10. The transparent electrode layers 222, 232 are formed, for example, using a sputtering method.

For example, nine electrode layers 223A are formed on one of the two opposite sides of the second photoelectric conversion element 20 on the transparent electrode layer 222. One electrode layer 233A is formed on each of the transparent electrode layers 232. For example, nine electrode layers 223A are formed on one side of the second photoelectric conversion element 20. Similarly, for example, nine electrode layers 223B are formed on the other of the two opposite sides of the second photoelectric conversion element 20 on the transparent electrode layer 222. One electrode layer 233B is formed on each of the transparent electrode layers 232. For example, nine electrode layers 233B are formed on the other side of the second photoelectric conversion element 20 (see FIG. 1 and FIG. 4 to be described later). The electrode layers 223A, 233A, 223B, 233B are formed of a conductive paste material containing metal powder such as silver powder, similarly to the electrode layers 123, 133 of the aforementioned first photoelectric conversion element 10. The electrode layers 223A, 233A, 223B, 233B are formed, for example, using a printing method.

Figure 4:
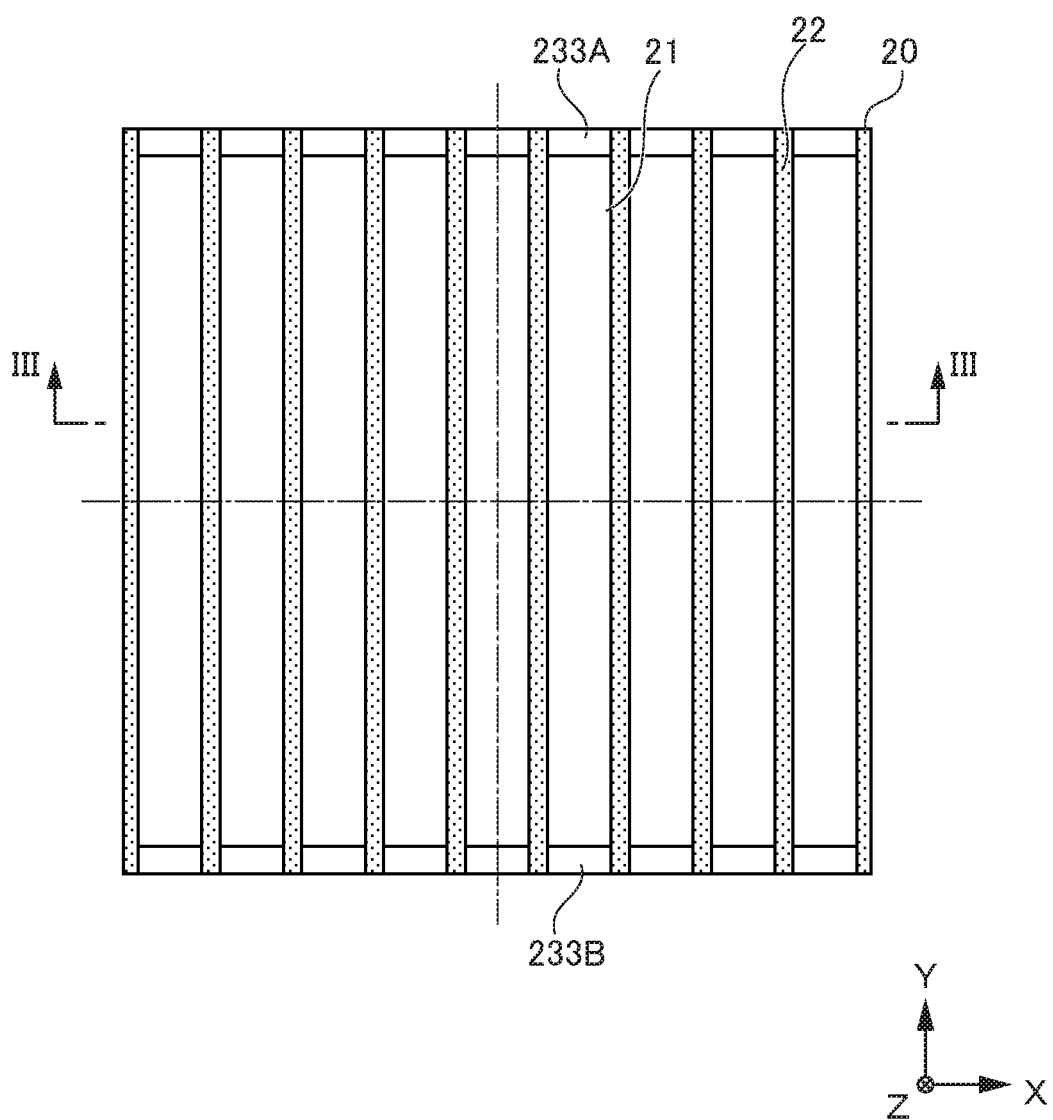
FIG. 4 is a view showing layers on the back surface side of a semiconductor substrate of the second photoelectric conversion element of FIGS. 1 and 3 from the light receiving surface side.

FIG. 4 is a view showing the layers 230, 231, 232, 233A, 233B on the back surface side of the semiconductor substrate 210 of the second photoelectric conversion element 20 of FIGS. 1 and 3 from the light receiving surface side. As shown in FIGS. 3 and 4, the second photoelectric conversion element 20 has, for example, the nine high-sensitive parts (first sensitive parts) 21 and the low-sensitive parts (second sensitive parts) 22. Sensitive areas appearing on the both principal surfaces (light receiving surface and back surface) of the semiconductor substrate 210 in the high-sensitive part 21 are high-sensitive regions (first sensitive regions), and sensitive regions appearing on the both principal surfaces of the semiconductor substrate 210 in the low-sensitive parts 22 are low-sensitive regions (second sensitive regions).

In the high-sensitive part 21, the passivation layers 220, 230, the conductivity type semiconductor layers 221, 231 and the transparent electrode layers 222, 232 are formed on the light receiving surface side and the back surface side of the semiconductor substrate 210 as described with reference to FIG. 3. On the other hand, in the low-sensitive parts 22, the passivation layer 230, the n-type semiconductor layer 231 and the transparent electrode layer 232 are not formed on the back surface side of the semiconductor substrate 210.

In other words, the passivation layer 220, the conductivity type semiconductor layer 221 and the transparent electrode layer 222 are formed in the high-sensitive region on the light receiving surface side of the high-sensitive part 21 and in the low-sensitive regions on the light receiving surface sides of the low-sensitive parts 22, and the passivation layer 230, the n-type semiconductor layer 231 and the transparent electrode layer 232 are formed in the high-sensitive region on the back surface side of the high-sensitive part 21. On the other hand, the passivation layer 230, the n-type semiconductor layer 231 and the transparent electrode layer 232 are not formed in the low-sensitive regions on the back surface sides of the low-sensitive parts 22.

Since the passivation layers 220, 230 are formed on the light receiving surface side and the back surface side in the high-sensitive part 21, the recombination of carriers generated in the high-sensitive part 21 of the semiconductor substrate 210 is suppressed and a life time of the carriers is relatively long. Thus, carrier recovery efficiency is relatively high and photoelectric conversion efficiency is relatively high in the high-sensitive part 21. On the other hand, since the passivation layer 230 is not formed on the back surface side in the low-sensitive parts 22, the recombination of carriers generated in the low-sensitive parts 22 of the semiconductor substrate 210 is not suppressed and the life time of the carriers is relatively short. Thus, carrier recovery efficiency is relatively low and photoelectric conversion efficiency is relatively low in the low-sensitive parts 22. In this embodiment, since neither the n-type semiconductor layer 231 nor the transparent electrode layer 232 is formed on the back surface sides of the low-sensitive parts 22, photoelectric conversion efficiency is nearly zero. In this application, "low sensitivity" shall include zero photoelectric conversion efficiency. As just described, the life time of the carrier differs and carrier recovery efficiency differs accordingly in the high-sensitive part 21 and the low-sensitive parts 22. As a result, photoelectric conversion efficiency (i.e. sensitivity) differs.

On the light receiving surface side of the low-sensitive part 22, the passivation layer 220, the p-type semiconductor layer 221 and the transparent electrode layer 222 are formed to be continuous with each of the passivation layer 220, the p-type semiconductor layer 221 and the transparent electrode layer 222 on the light receiving surface side of the high-sensitive part 21. Thus, optical characteristics (e.g. reflection characteristic) become uniform on the light receiving surface side.

Figure 5:
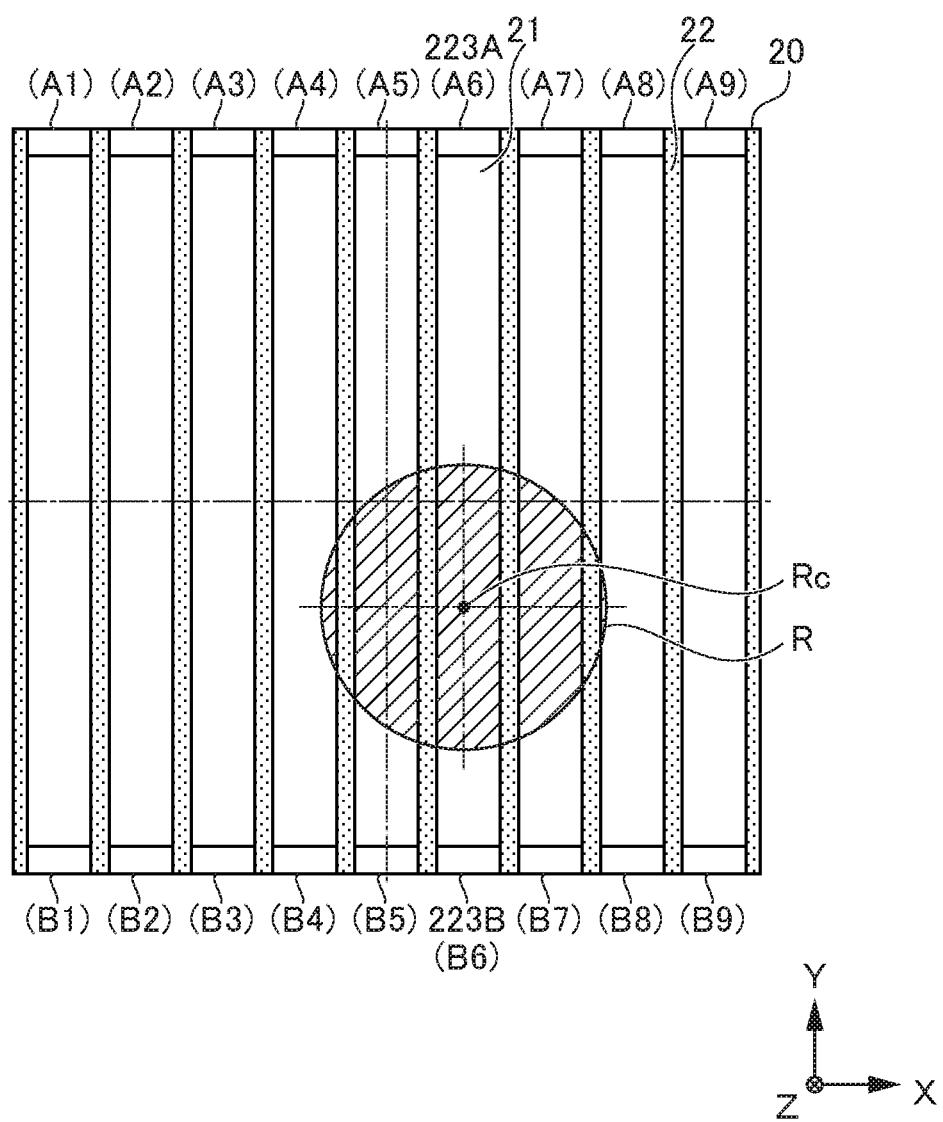
FIG. 5 is a view showing a state where incident light is incident on the second photoelectric conversion element of FIG. 4.

The high-sensitive region on the back surface side of the high-sensitive part 21 forms strip-like patterns extending in the Y direction. The strip-like patterns in the high-sensitive region on the back surface side of the high-sensitive part 21 have a constant width. The nine high-sensitive parts 21 are arrayed in the X direction (predetermined direction) intersecting a longitudinal direction of the strip-like patterns. Thus, if one high-sensitive part 21 is viewed, as the irradiation region R irradiated with the incident light on the light receiving surface increases (i.e. as the density of the incident light decreases) as shown in FIG. 5, in the irradiation region R, a ratio of this one high-sensitive part 21 (high-sensitive region) to the high-sensitive parts 21 (high-sensitive regions) other than this one high-sensitive part 21 and the low-sensitive parts 22 (low-sensitive regions) becomes smaller. Therefore, an output current of this one high-sensitive part 21 decreases as the spot size of the incident light on the light receiving surface increases.

Figure 6:
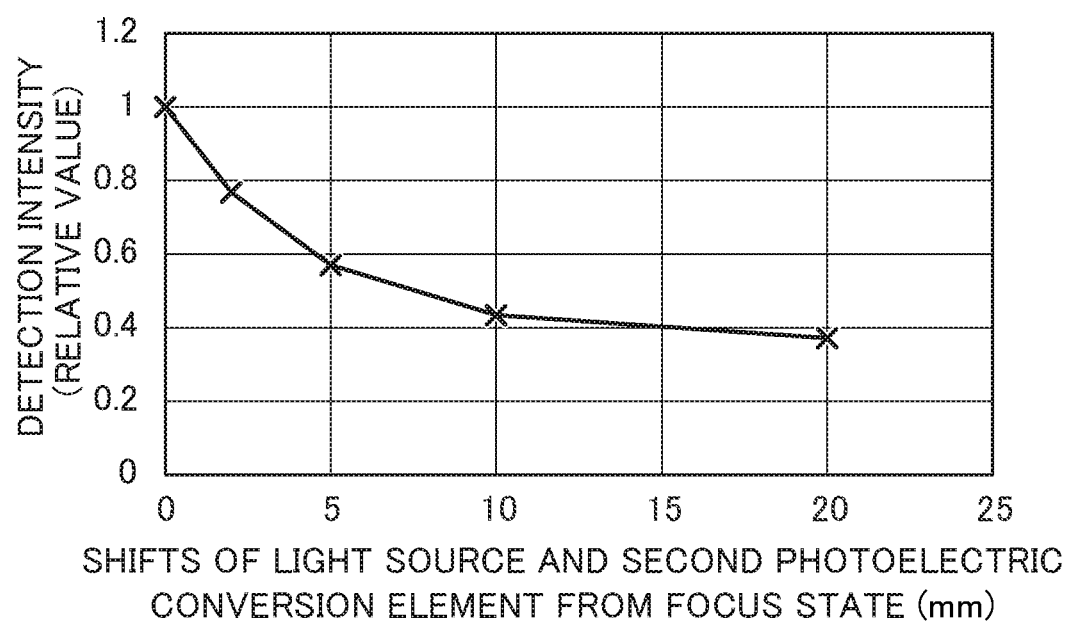
FIG. 6 is a graph showing an example of detection intensities (relative values) of the incident light with one first sensitive part in the second photoelectric conversion element when a light source is moved away from the second photoelectric conversion element from a state where the incident light from the light source is focused on the light receiving surface of the second photoelectric conversion element (0 mm on a horizontal axis)

FIG. 6 is a graph showing an example of detection intensities (relative values) of incident light with one high-sensitive part 21 in the second photoelectric conversion element 20 when the light source is moved away from the second photoelectric conversion element 20 from a state where the incident light (wavelength of 940 nm) from the light source is focused on the light receiving surface of the second photoelectric conversion element 20 (0 mm on a horizontal axis). FIG. 6 shows a characteristic when the high-sensitive region of the high-sensitive part 21 forms a strip-like pattern extending in the Y direction of the light receiving surface as shown in FIG. 4 and the width thereof is 0.5 mm According to FIG. 6, it is understood that detection intensities of the incident light with one high-sensitive part 21 in the second photoelectric conversion element 20 decrease as the light source is moved away from the second photoelectric conversion element 20, i.e. as the spot size of the incident light on the light receiving surface of the second photoelectric conversion element 20 increases.

<Function and Operation of Calculator>

The calculator 40 obtains distribution data on currents output from, for example, nine pairs of the electrode layers 223A (233A), 223B (233B) in each of the nine high-sensitive parts 21 of the second photoelectric conversion element 20. The obtained data may be temporarily stored in, for example, the storage 30.

Figure 7A:
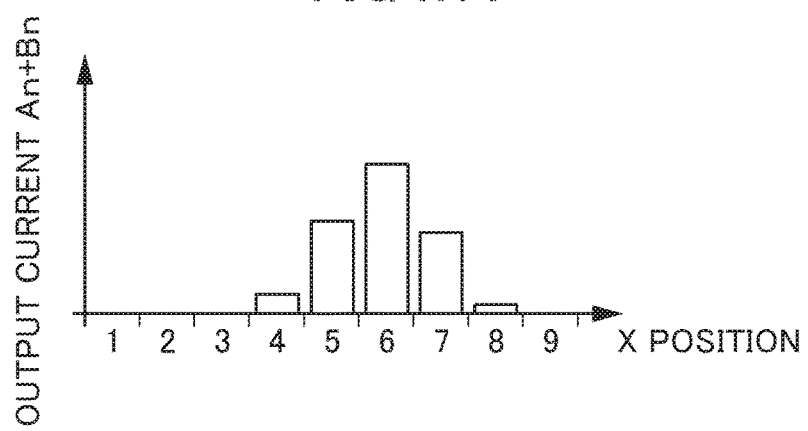
FIG. 7A is a schematic view of distribution data on a sum An+Bn of an output current An of an electrode layer on one side of each of nine pairs of first sensitive parts of the second photoelectric conversion element and an output current Bn of an electrode layer on the other side.
Figure 7B:
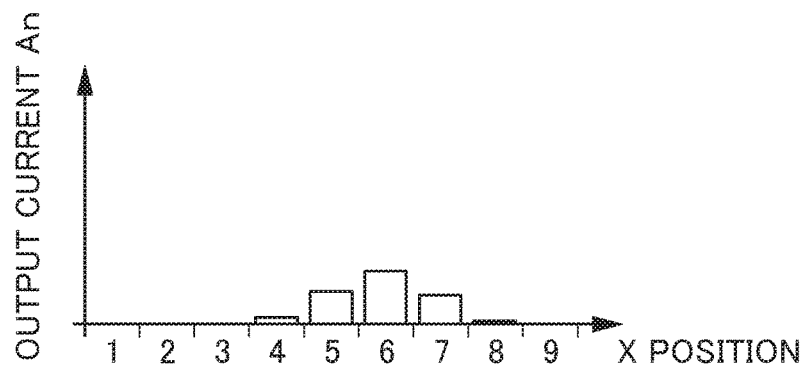
FIG. 7B is a schematic view of distribution data on the output current An of the electrode layer on one side of each of the nine pairs of the first sensitive parts of the second photoelectric conversion element.
Figure 7C:
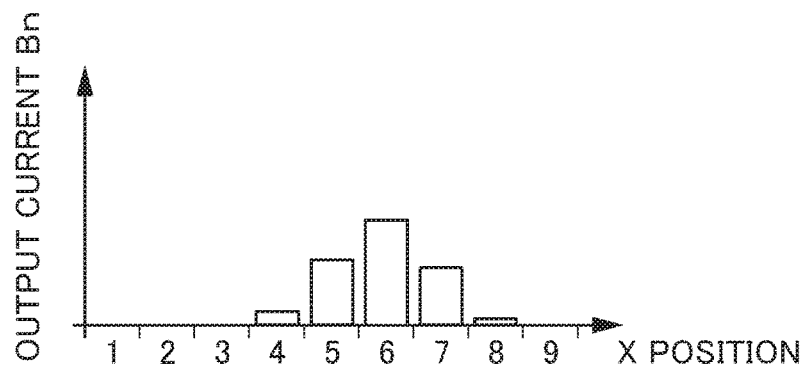
FIG. 7C is a schematic view of a current distribution of the output current Bn of the electrode layer on the other side of each of the nine pairs of the first sensitive parts of the second photoelectric conversion element.

For example, output currents An of the nine electrode layers 223A (233A) on one of the two opposite sides of the second photoelectric conversion element 20 are referred to as A1, A2, A3, A4, A5, A6, A7, A8 and A9, and output currents Bn of the nine electrode layers 223B (233B) on the other of the two opposite sides of the second photoelectric conversion element 20 are referred to as B1, B2, B3, B4, B5, B6, B7, B8 and B9. FIG. 7A is a schematic view of distribution data on a sum An+Bn of an output current An of the electrode layer 223A (233A) on one side of a pair in each of the nine high-sensitive parts 21 of the second photoelectric conversion element 20 and an output current Bn of the electrode layer 223B (233B) on the other side. FIG. 7B is a schematic view of distribution data on the output current An of the electrode layer 223A (233A) on one side of a pair in each of the nine high-sensitive parts 21 of the second photoelectric conversion element 20, and FIG. 7C is a schematic view of distribution data on the output current Bn of the electrode layer 223B (233B) on the other side of a pair in each of the nine high-sensitive parts 21 of the second photoelectric conversion element 20. In FIGS. 7A to 7C, a current becomes maximum in a center Rc of the irradiation region R of incident light, and a current becomes smaller as the distance becomes greater from the center Rc of the irradiation region R of incident light. Thus, an X position (coordinates) (e.g. an X position of the center Rc of an irradiation region R of incident light) of incident light on the light receiving surface of the second photoelectric conversion element 20 is known from current distribution data of the nine pairs of the electrode layers 223A (233A), 223B (233B) of the second photoelectric conversion element 20. In FIGS. 7B and 7C, a ratio An:Bn of currents is approximately 50:50 when the center Rc of the irradiation region R of incident light is located in the center in the Y direction, and the ratio An:Bn of currents substantially linearly changes as the center Rc of the irradiation region R of incident light shifts from the center in the Y direction toward the electrode layers 223A (233A), 223B (233B). Thus, the Y position (coordinates) of the incident light on the light receiving surface of the second photoelectric conversion element 20 (e.g. the Y position of the center Rc of the irradiation region R of the incident light) is known from the ratio An:Bn of currents.

Thus, the calculator 40 calculates and detects the X position (coordinates) of incident light on the light receiving surface of the second photoelectric conversion element 20 from a maximum current point, based on the distribution data of the sum An+Bn of the currents shown in FIG. 7A. The calculator 40 may calculate and detect the X position (coordinates) of incident light on the light receiving surface of the second photoelectric conversion element 20, based on one of the distribution data of the current An shown in FIG. 7B and the distribution data of the current Bn shown in FIG. 7C, instead of the distribution data of the sum An+Bn of the currents shown in FIG. 7A. The calculator 40 calculates and detects the Y position (coordinates) of incident light on the light receiving surface of the second photoelectric conversion element 20 from the ratio An:Bn of currents, based on the distribution data on each of the current An shown in FIG. 7B and the current Bn shown in FIG. 7C.

The calculator 40 refers to the table stored in the storage 30 and obtains and detects the spot size of the incident light on the light receiving surface of the second photoelectric conversion element 20 corresponding to the total amount of the currents output from four pairs of the electrode layers 123 (133) of the first photoelectric conversion element 10 (i.e. the intensity (total amount) of the incident light on the first photoelectric conversion element 10) and the sum (e.g. A6+B6 in FIGS. 5 and 7A) of the currents output from the electrode layers 223A (233A) and the electrode layers 223B (233B) in the high-sensitive part 21 at the maximum current point of the second photoelectric conversion element 20 (i.e. the intensity of the incident light on one high-sensitive part 21 of the second photoelectric conversion element 20), and the position (i.e. a distance in the Z direction) of the subject in the Z direction (depth).

The calculator 40 obtains an incident direction of the incident light from the XY position (coordinates) of the incident light on the light receiving surface of the first photoelectric conversion element 10 and the XY position (coordinates) of the incident light on the light receiving surface of the second photoelectric conversion element 20, and detects the three-dimensional position of the subject from the obtained incident direction of the incident light and the position (i.e. a distance in the Z direction) in the Z direction (depth).

As described above, the first photoelectric conversion element 10 generates a current corresponding to the intensity (total amount) of incident light incident on the light receiving surface in the photoelectric conversion device 1 according to this embodiment. The first photoelectric conversion element 10 distributes and outputs the generated current to four pairs of the electrode layers 123, 133 arranged on the four sides according to the XY position (coordinates) of the center of the incident light on the light receiving surface (XY plane). The second photoelectric conversion element 20 generates a current corresponding to the intensity of incident light incident on, for example, each of the nine high-sensitive parts 21 on the light receiving surface. In this way, the second photoelectric conversion element 20 generates a current corresponding to the density of the incident light, i.e. a current corresponding to the spot size of the incident light. The second photoelectric conversion element 20 distributes and outputs the generated current to the nine electrode layers 223A (233A) arranged on one of the two opposite sides and the nine electrode layers 223B (233B) arranged on the other side according to the XY position (coordinates) of the center of the incident light on the light receiving surface (XY plane).

The calculator 40 calculates and detects the intensity (total amount) of the incident light according to the total amount of the currents output from the four pairs of the electrode layers 123, 133 of the first photoelectric conversion element 10.

The calculator 40 also calculates and detects the XY position (coordinates) of the incident light on the light receiving surface of the first photoelectric conversion element 10 based on a ratio of the currents respectively output from the four pairs of the electrode layers 123, 133 of the first photoelectric conversion element 10. The calculator 40 also calculates and detects the XY position (coordinates) of the incident light on the light receiving surface of the second photoelectric conversion element 20 based on the distribution and ratio of the currents output from the nine electrode layers 223A (233A) and the nine electrode layers 223B (233B) of the second photoelectric conversion element 20. The calculator 40 calculates and detects the incident direction of the incident light from the XY position (coordinates) of the incident light on the light receiving surface of the first photoelectric conversion element 10 and the XY position (coordinates) of the incident light on the light receiving surface of the second photoelectric conversion element 20.

The calculator 40 also refers to the table stored in the storage 30 and obtains and detects the spot size of the incident light on the light receiving surface of the second photoelectric conversion element 20 corresponding to the total amount of the currents output from the four pairs of the electrode layers 123, 133 of the first photoelectric conversion element 10 (i.e. the intensity (total amount) of the incident light on the first photoelectric conversion element 10) and the sum of the currents output from the electrode layers 223A (233A) and the electrode layers 223B (233B) in the high-sensitive part 21 of the second photoelectric conversion element 20 (i.e. the intensity of the incident light on one high-sensitive part of the second photoelectric conversion element 20) at the maximum current point shown in FIG. 7A, and the position (i.e. a distance in the Z direction) of the subject in the Z direction (depth).

Thus, the calculator 40 detects the three-dimensional position of the subject from the obtained incident direction of the incident light and the position (i.e. a distance in the Z direction) in the Z direction (depth).

The second photoelectric conversion element 20 is provided with a plurality of pairs of electrodes 223A (233A), 223B (233B) for outputting currents from the aforementioned plurality of first sensitive parts 21, and the pairs of the electrodes 223A (233A), 223B (233B) in each of the plurality of first sensitive parts 21 are separately arranged on two sides of the second photoelectric conversion element 20 in the longitudinal direction of the strip-like pattern of the first sensitive region. Thus, the principal surface of the second photoelectric conversion element 20 is an XY plane, a direction orthogonal to the XY plane is a Z direction, and the aforementioned predetermined direction is an X direction, in which case the calculator 40 can obtain the position of a light source of incident light in the X direction based on a maximum point of the distribution of the output current An+Bn of the plurality of high-sensitive parts 21 of the second photoelectric conversion element 20, obtain the position of the light source of the incident light in the Y direction based on a ratio between the output current An of the electrodes 223A (233A) on one of the two sides of the second photoelectric conversion element 20, and an output current Bn of the electrodes 223B (233B) on the other side, and obtain the position of the light source of the incident light in the Z direction based on the spot size of the incident light in the second photoelectric conversion element 20.

According to the photoelectric conversion device 1 of this embodiment, the plurality of high-sensitive parts 21 are arrayed on the light receiving surface of the second photoelectric conversion element 20, and a detection region can therefore be substantially enlarged.

Modification of First Embodiment

Although the photoelectric conversion element 20 in which the passivation layer 230, the n-type semiconductor layer 231 and the transparent electrode layer 232 are not formed on the back surface sides of the low-sensitive parts 22 is illustrated in this embodiment, there is no limitation to this. The second photoelectric conversion element 20 may be formed such that a passivation layer, a conductivity type semiconductor layer and a transparent electrode layer are not formed on at least one of the light receiving surface side and the back surface side of the low-sensitive part 22. In other words, strip-like pattern(s) in the high-sensitive part 21 (high-sensitive region) may be formed on at least one of the light receiving surface side and the back surface side of the second photoelectric conversion element 20.

For example, contrary to the aforementioned embodiment, strip-like pattern(s) of the high-sensitive part 21 (high-sensitive region) may be formed on the light receiving surface side of the second photoelectric conversion element 20. More specifically, the passivation layer 230, the n-type semiconductor layer 231 and the transparent electrode layer 232 are formed in the high-sensitive region on the back surface side of the high-sensitive part 21 and in the low-sensitive regions on the back surface sides of the low-sensitive parts 22, and the passivation layer 220, the conductivity type semiconductor layer 221 and the transparent electrode layer 222 are formed in the high-sensitive region on the light receiving surface side of the high-sensitive part 21. On the other hand, the passivation layer 220, the conductivity type semiconductor layer 221 and the transparent electrode layer 222 are not formed in the low-sensitive regions on the light receiving surface sides of the low-sensitive parts 22. Since the recombination of carriers increases on the light receiving surface sides, where light is more absorbed, in the low-sensitive parts 22 in this case, a sensitivity difference between the high-sensitive part 21 and the low-sensitive parts 22 particularly with respect to a short wavelength region of the incident light becomes clearer. In this case, optical characteristics (e.g. reflection characteristic) on the light receiving surface may be separately adjusted.

A transparent electrode layer may be formed or a conductivity type semiconductor layer and a transparent electrode layer may be formed in the low-sensitive parts 22 of the second photoelectric conversion element 20. Particularly, if the transparent electrode layer is formed on the light receiving surface sides of the low-sensitive regions of the second photoelectric conversion element 20 when the passivation layer is not formed, optical characteristics (e.g. reflection characteristic) on the light receiving surface side are improved.

Although the first sensitive part 21 (first sensitive region) is a high-sensitive part (high-sensitive region) and the second sensitive part 22 (second sensitive region) is a low-sensitive part (low-sensitive region) in the second photoelectric conversion element 20 in this embodiment, the arrangement may be reversed. In other words, the first sensitive part 21 (first sensitive region) may be a low-sensitive part (low-sensitive region) and the second sensitive part 22 (second sensitive region) may be a high-sensitive part (high-sensitive region) in the second photoelectric conversion element 20. In this case, the output current of each of the first sensitive parts 21 increases as the density of the incident light decreases, i.e. as the spot size of the incident light becomes larger.

Second Embodiment

In the first embodiment, the intensity (total amount) of incident light is detected by using the first photoelectric conversion element 10. In a second embodiment, the first photoelectric conversion element 10 is not used, and a photoelectric conversion element which can also detect the intensity (total amount) of incident light is used as a second photoelectric conversion element.

Figure 8:
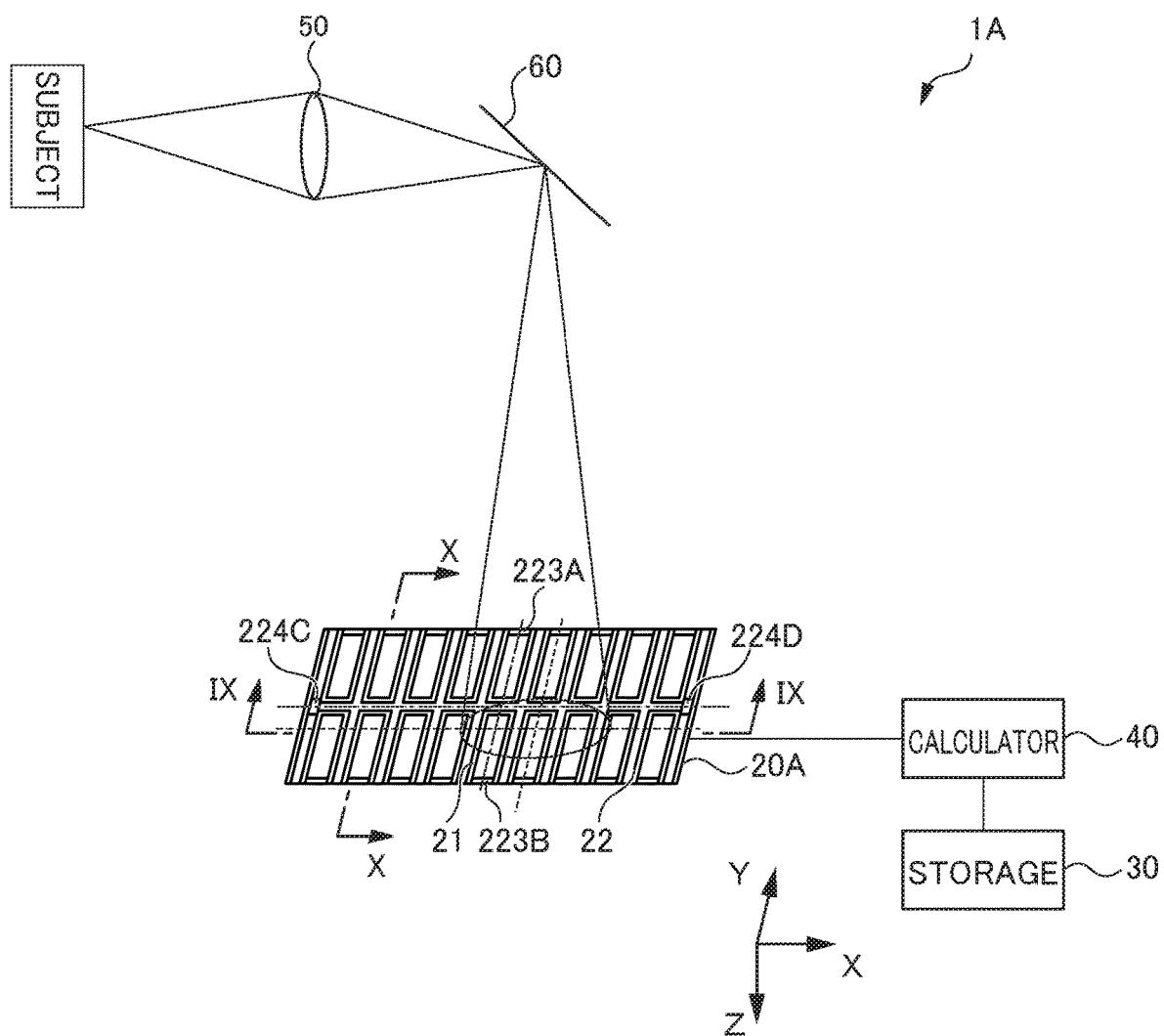
FIG. 8 is a view showing the configuration of a photoelectric conversion device (three-dimensional sensor) according to a second embodiment.

FIG. 8 is a view showing the configuration of a photoelectric conversion device according to the second embodiment. A photoelectric conversion device 1A shown in FIG. 8 is different from the first embodiment in the configuration which is not provided with the first photoelectric conversion element 10 in the photoelectric conversion device 1 shown in FIG. 1 and which includes a photoelectric conversion element 20A instead of the second photoelectric conversion element 20. In the photoelectric conversion device 1A, data stored in a storage 30, and the function and operation of a calculator 40 are different from those in the photoelectric conversion device 1.

<Configuration of Photoelectric Conversion Element>

Figure 9:
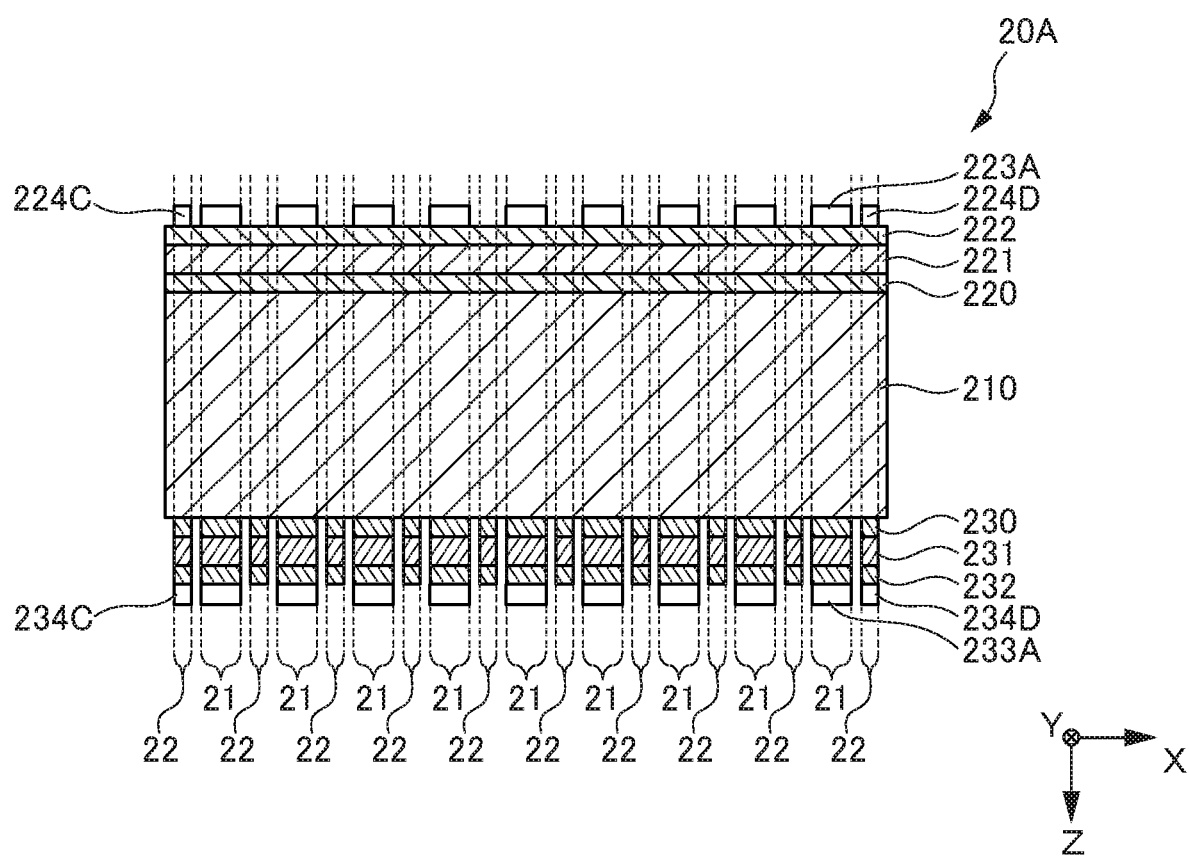
FIG. 9 is a sectional view along line IX-IX in a photoelectric conversion element of FIG. 8.
Figure 10:
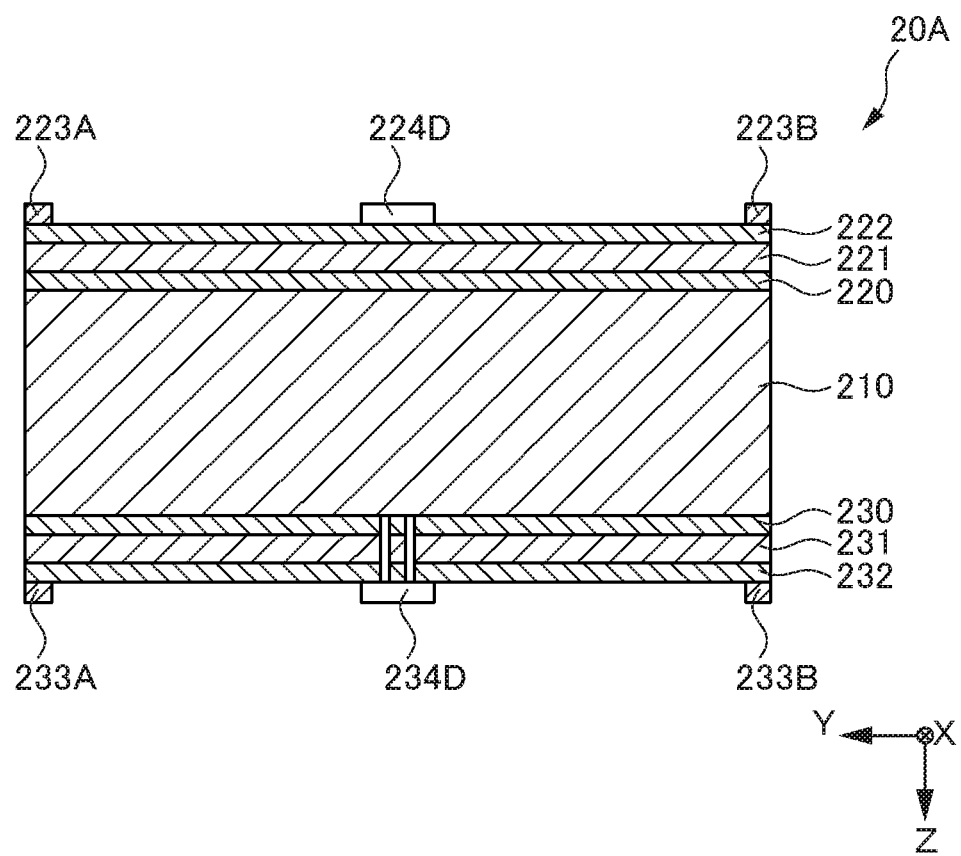
FIG. 10 is a sectional view along line X-X in the photoelectric conversion element of FIG. 8.
Figure 11:
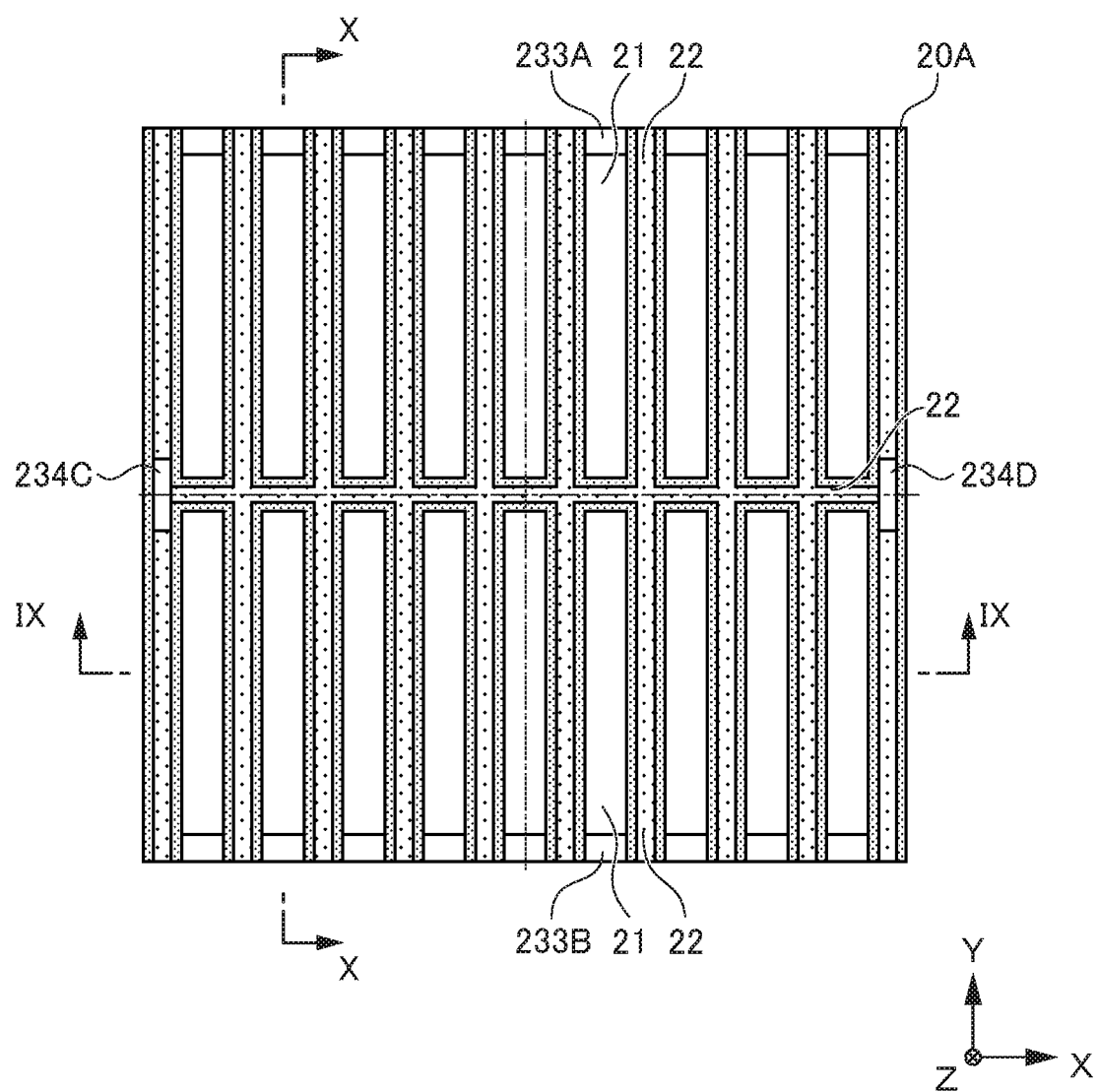
FIG. 11 is a view showing layers on the back surface side of a semiconductor substrate of the photoelectric conversion element of FIGS. 8 to 10 from the light receiving surface side.

FIG. 9 is a sectional view along line IX-IX in the photoelectric conversion element 20A of FIG. 8. FIG. 10 is a sectional view along line X-X in the photoelectric conversion element 20A of FIG. 8. FIG. 11 is a view showing layers 230, 231, 232 on the back surface side of a semiconductor substrate 210 of the photoelectric conversion element 20A of FIGS. 8 to 10 from the light receiving surface side. The photoelectric conversion element 20A is different from the second photoelectric conversion element 20 shown in FIG. 3 in being provided with a first sensitive part 21 and a second sensitive part 22 which are both highly sensitive and are separated.

As shown in FIGS. 9 and 10, the photoelectric conversion element 20A is provided with an n-type (second conductivity type) semiconductor substrate (photoelectric conversion substrate) 210, and a passivation layer 220, a p-type (first conductivity type) semiconductor layer 221, a transparent electrode layer 222, an electrode layer (first electrode) 223A, 223B and an electrode layer (second electrode) 224C, 224D successively laminated on the light receiving surface side of the semiconductor substrate 210. The photoelectric conversion element 20A is also provided with a passivation layer 230, an n-type (second conductivity type) semiconductor layer 231, a transparent electrode layer 232, electrode layers (first electrodes) 233A, 233B and electrode layers (second electrodes) 234C, 234D successively laminated in a first specific region and a second specific region on the back surface side of the semiconductor substrate 210.

A laminated part in this first specific region, i.e. a laminated part formed by the transparent electrode layer 232, the n-type semiconductor layer 231, the passivation layer 230, the semiconductor substrate 210, the passivation layer 220, the p-type semiconductor layer 221 and the transparent electrode layer 222 is referred to as a first sensitive part 21. A laminated part in the second specific region, i.e. a laminated part formed by the transparent electrode layer 232, the n-type semiconductor layer 231, the passivation layer 230, the semiconductor substrate 210, the passivation layer 220, the p-type semiconductor layer 221 and the transparent electrode layer 222 is referred to as a second sensitive part 22.

The passivation layer 220, the p-type semiconductor layer 221 and the transparent electrode layer 222 are successively and continuously formed on the whole light receiving surface on the light receiving surface side of the semiconductor substrate 210. On the other hand, the passivation layer 230, the n-type semiconductor layer 231 and the transparent electrode layer 232 are successively formed on the back surface side of the semiconductor substrate 210 separately into the first sensitive part 21 and the second sensitive part 22 on the back surface.

One electrode layer 223A is formed on the transparent electrode layer 222, i.e. on each of, for example, the nine first sensitive parts 21 on the light receiving surface side of the semiconductor substrate 210. These nine electrode layers 223A are formed on one of the two opposite sides of the photoelectric conversion element 20A. One electrode layer 233A is formed on each transparent electrode layer 232, i.e. on each of, for example, the nine first sensitive parts 21 on the back surface side of the semiconductor substrate 210. These nine electrode layers 233A are formed on one side of the photoelectric conversion element 20A. Similarly, one electrode layer 223B is formed on the transparent electrode layer 222, i.e. on each of, for example, the nine first sensitive parts 21 on the light receiving surface side of the semiconductor substrate 210. The nine electrode layers 223B are formed on the other of the two opposite sides of the photoelectric conversion element 20A. One electrode layer 233B is formed on each transparent electrode layer 232, i.e. on each of, for example, the nine first sensitive parts 21 on the back surface side of the semiconductor substrate 210. The nine electrode layers 233B are formed on the other side of the photoelectric conversion element 20A. The electrode layer 224C is formed on the transparent electrode layer 222, i.e. on one of the two opposite sides of the photoelectric conversion element 20A in the second sensitive part 22 on the light receiving surface side of the semiconductor substrate 210, and the electrode layer 234C is formed on the transparent electrode layer 232, i.e. on one of the other two opposite sides of the photoelectric conversion element 20A in the second sensitive part 22 on the back surface side of the semiconductor substrate 210. Similarly, the electrode layer 224D is formed on the transparent electrode layer 222, i.e. on the other of the other two opposite sides of the photoelectric conversion element 20A in the second sensitive part 22 on the light receiving surface side of the semiconductor substrate 210, and the electrode layer 234D is formed on the transparent electrode layer 232, i.e. on the other of the other two opposite sides of the photoelectric conversion element 20A in the second sensitive part 22 on the back surface side of the semiconductor substrate 210.

As shown in FIGS. 9 to 11, the photoelectric conversion element 20A has, for example, nine pairs of the first sensitive parts 21 and the second sensitive parts 22. Sensitive regions appearing on the both principal surfaces (light receiving surface and back surface) of the semiconductor substrate 210 in the first sensitive part 21 are first sensitive regions, and sensitive regions appearing on the both principal surfaces of the semiconductor substrate 210 in the second sensitive parts 22 are second sensitive regions.

As shown in FIGS. 9 to 11, the passivation layer 230, the n-type semiconductor layer 231 and the transparent electrode layer 232 formed on the back surface side of the semiconductor substrate 210 are separated between the first sensitive part 21 and the second sensitive part 22. On the other hand, the passivation layer 220, the p-type semiconductor layer 221 and the transparent electrode layer 222 formed on the light receiving surface side of the semiconductor substrate 210 continue between the first sensitive part 21 and the second sensitive part 22. In other words, the passivation layer 220, the p-type semiconductor layer 221 and the transparent electrode layer 222 are formed on the whole light receiving surface side of the semiconductor substrate 210. Thus, optical characteristics (e.g. reflection characteristic) become uniform on the light receiving surface side.

The photoelectric conversion characteristic (sensitivity) of the first sensitive part 21 may be the same or different from the photoelectric conversion characteristic (sensitivity) of the second sensitive part 22.

Figure 12:
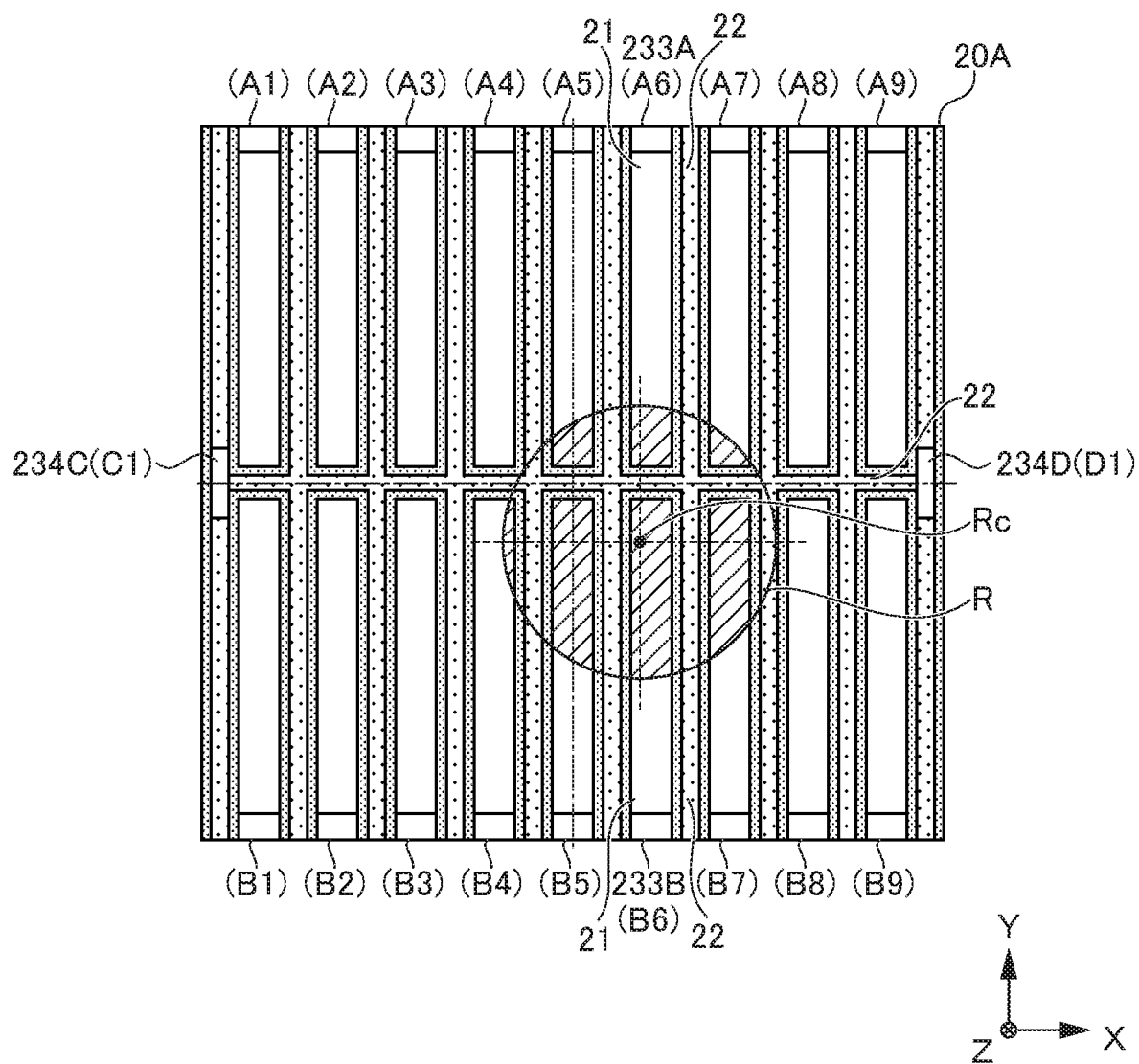
FIG. 12 is a view showing a state where incident light is incident on the photoelectric conversion element of FIG. 11.

The first sensitive region on the back surface side of the first sensitive part 21 forms strip-like patterns extending in the Y direction. The strip-like patterns in the first sensitive region of the first sensitive part 21 have a constant width. The nine pairs of the first sensitive parts 21 are arrayed in the X direction (predetermined direction) intersecting a longitudinal direction of the strip-like patterns. The second sensitive part 22 is formed between the respective first sensitive parts 21 in the X direction, and the second sensitive part 22 is connected by a pattern extending in the X direction in the vicinity of the center in the Y direction. The first sensitive parts 21 adjacent in the Y direction via a pattern extending in the X direction of the low-sensitive part 22 make a pair. Thus, if one pair of the first sensitive parts 21 adjacent in the Y direction is viewed, as the irradiation region R irradiated with the incident light on the light receiving surface increases (i.e. as the density of the incident light decreases) as shown in FIG. 12, in the irradiation region R, a ratio of this one pair of the first sensitive parts 21 (first sensitive regions) to the first sensitive parts 21 (first sensitive regions) other than this one pair of the first sensitive parts 21 and the second sensitive parts 22 (second sensitive regions) becomes smaller. Therefore, the output current of this one pair of the first sensitive parts 21 decreases as the spot size of the incident light on the light receiving surface increases.

With such a configuration, the photoelectric conversion element 20A generates a current corresponding to the intensity of incident light incident on each of, for example, the nine pairs of the first sensitive parts 21. The photoelectric conversion element 20A distributes and outputs the current generated in the first sensitive part 21 to nine electrode layers 223A (233A) arranged on one of the two opposite sides and the nine electrode layers 223B (233B) arranged on the other side according to a center position (coordinates) (hereinafter, also referred to as an XY position) of the incident light on the light receiving surface (XY plane). The photoelectric conversion element 20A generates a current corresponding to the intensity of incident light incident on the second sensitive part 22. The photoelectric conversion element 20A distributes and outputs the current generated in the second sensitive part 22 to two electrode layers 224C (234C), 224D (234D) arranged on the other two opposite sides according to a center position (coordinates) (hereinafter, also referred to as an XY position) of the incident light on the light receiving surface (XY plane).

Thus, the photoelectric conversion element 20A generates a current corresponding to the intensity (total amount) of incident light as the sum of the currents of nine pairs of the electrode layers 223A (233A), 223B (233B) of the first sensitive part 21 and the currents of the two electrode layers 224C (234C), 224D (234D) of the second sensitive part 22. The photoelectric conversion element 20A generates a current corresponding to the Y position (coordinates) of the incident light on the light receiving surface for the nine electrode layers 223A (233A) and the nine electrode layers 223B (233B) of the first sensitive part 21. The photoelectric conversion element 20A generates a current corresponding to the X position (coordinates) of the incident light on the light receiving surface for the nine electrode layers 223A (233A) and the nine electrode layers 223B (233B) of the first sensitive part 21. The photoelectric conversion element 20A generates a current corresponding to the X position (coordinates) of the incident light on the light receiving surface for each of the two electrode layers 224C (234C), 224D (234D) of the second sensitive part 22. The photoelectric conversion element 20A generates a current corresponding to the density of the incident light, i.e. a current corresponding to the spot size of the incident light as the sum of the currents of each of the nine pairs of the electrode layers 223A (233A), 223B (233B) of the first sensitive part 21.

In this embodiment, the storage 30 stores in advance a table associating output currents (total amounts) of the first sensitive part 21 and the second sensitive part 22 of the photoelectric conversion element 20A (i.e. the intensity (total amount) of incident light on the photoelectric conversion element 20A) and an output current (total amount) of the first sensitive part 21 of the photoelectric conversion element 20A (i.e. the intensity of the incident light on the first sensitive part 21 of the photoelectric conversion element 20A) with the spot size of the incident light on the light receiving surface of the photoelectric conversion element 20A, and further associating the position (i.e. a distance in the Z direction) of the subject in the Z direction (depth) with this spot size.

<Function and Operation of Calculator>

The calculator 40 obtains distribution data on currents output from, for example, the nine electrode layers 223A (233A) and the nine electrode layers 223B (233B) in the nine pairs of the first sensitive parts 21 of the photoelectric conversion element 20A, and data on currents output from the two electrode layers 224C (234C), 224D (234D) of the second sensitive part 22. The obtained data may be temporarily stored in, for example, the storage 30.

For example, output currents An of the nine electrode layers 223A (233A) on one of the two opposite sides of the photoelectric conversion element 20A among the electrode layers of the first sensitive part 21 of the photoelectric conversion element 20A are referred to as A1, A2, A3, A4, A5, A6, A7, A8 and A9, and output currents Bn of the nine electrode layers 223B (233B) on the other of the two opposite sides of the photoelectric conversion element 20A among the electrode layers of the first sensitive part 21 of the photoelectric conversion element 20A are referred to as B1, B2, B3, B4, B5, B6, B7, B8 and B9. Output currents of the two electrode layers 224C (234C), 224D (234D) of the second sensitive part 22 of the photoelectric conversion element 20A are referred to as C1, D1. In this case, distribution data on a sum An+Bn of an output current An of the nine electrode layers 223A (233A) of the nine pairs of the first sensitive parts 21 and an output current Bn of the nine electrode layers 223B (233B) are represented as FIG. 7A described above. Distribution data on the output current An of the nine electrode layers 223A (233A) of the nine pairs of the first sensitive parts 21 are represented as FIG. 7B described above, and distribution data on the output current Bn of the nine electrode layers 223B (233B) of the nine pairs of the first sensitive parts 21 are represented as FIG. 7C described above.

Thus, the calculator 40 calculates and detects the X position (coordinates) of incident light on the light receiving surface of the photoelectric conversion element 20A from a maximum current point, based on the distribution data of the sum An+Bn of the currents shown in FIG. 7A. The calculator 40 may calculate and detect the X position (coordinates) of incident light on the light receiving surface of the photoelectric conversion element 20A, based on one of the distribution data of the current An shown in FIG. 7B and the distribution data of the current Bn shown in FIG. 7C, instead of the distribution data of the sum An+Bn of the currents shown in FIG. 7A. The calculator 40 may calculate and detect the X position (coordinates) of incident light on the light receiving surface of the photoelectric conversion element 20A from the ratio C1:D1 of currents, based on the current C1 and the current D1. The calculator 40 calculates and detects the Y position (coordinates) of incident light on the light receiving surface of the photoelectric conversion element 20A from the ratio An:Bn of currents, based on the distribution data on each of the current An shown in FIG. 7B and the current Bn shown in FIG. 7C.

The calculator 40 calculates and detects the total amount of the output currents An, Bn of the first sensitive part 21 and the output currents C1, D1 of the second sensitive part 22 as the intensity (total amount) of incident light.

The calculator 40 also refers to the table stored in the storage 30 and obtains and detects the spot size of the incident light on the light receiving surface of the photoelectric conversion element 20A corresponding to the total amount of the currents output from all the electrode layers 223A (233A), 223B (233B), 224C (234C), 224D (234D) of the photoelectric conversion element 20A (i.e. the intensity (total amount) of the incident light on the photoelectric conversion element 20A) and the sum (e.g. A6+B6 in FIGS. 12 and 7A) of the currents output from the electrode layers 223A (233A), 223B (233B) of one pair of the first sensitive parts 21 of the photoelectric conversion element 20A (i.e. the intensity of the incident light on one first sensitive part 21 of the photoelectric conversion element 20A), and the position (i.e. a distance in the Z direction) of the subject in the Z direction (depth).

If, for example, the XY position (coordinates) of the center of the photoelectric conversion element 20A relative to the XY position (coordinates) of the center of an optical lens 50 is known in advance, the calculator 40 obtains an incident direction of the incident light from the XY position (coordinates) of the center of an optical lens 50 and the XY position (coordinates) of the incident light on the light receiving surface of the photoelectric conversion element 20A, and detects the three-dimensional position of the subject from the obtained incident direction of the incident light and the position (i.e. a distance in the Z direction) in the Z direction (depth).

As described above, in the photoelectric conversion device 1A according to this embodiment, the photoelectric conversion element 20A generates a current corresponding to the intensity of incident light incident on each of, for example, the nine pairs of the first sensitive parts 21. The photoelectric conversion element 20A distributes and outputs the generated current to the nine electrode layers 223A (233A) arranged on one of the two opposite sides and the nine electrode layers 223B (233B) arranged on the other side according to the XY position (coordinates) of the center of the incident light on the light receiving surface (XY plane). The photoelectric conversion element 20A generates a current corresponding to the intensity of incident light incident on the second sensitive part 22. The photoelectric conversion element 20A distributes and outputs the generated current to the two electrode layers 224C (234C), 224D (234D) arranged on the other two opposite sides according to the XY position (coordinates) of the center of the incident light on the light receiving surface (XY plane).

Thus, the photoelectric conversion element 20A generates a current corresponding to the intensity (total amount) of incident light as the sum of the currents of nine pairs of the electrode layers 223A (233A), 223B (233B) of the first sensitive part 21 and the currents of the two electrode layers 224C (234C), 224D (234D) of the second sensitive part 22. The photoelectric conversion element 20A generates a current corresponding to the Y position (coordinates) of the incident light on the light receiving surface for the nine electrode layers 223A (233A) and the nine electrode layers 223B (233B) of the first sensitive part 21. The photoelectric conversion element 20A generates a current corresponding to the X position (coordinates) of the incident light on the light receiving surface for the nine electrode layers 223A (233A) and the nine electrode layers 223B (233B) of the first sensitive part 21. The photoelectric conversion element 20A generates a current corresponding to the X position (coordinates) of the incident light on the light receiving surface for each of the two electrode layers 224C (234C), 224D (234D) of the second sensitive part 22. The photoelectric conversion element 20A generates a current corresponding to the density of the incident light, i.e. a current corresponding to the spot size of the incident light as the sum of the currents of each of the nine pairs of the electrode layers 223A (233A), 223B (233B) of the first sensitive part 21.

The calculator 40 calculates and detects the intensity (total amount) of the incident light according to the total amount of the currents output from the nine pairs of the electrode layers 223A (233A), 223B (233B) of the first sensitive part 21 of the photoelectric conversion element 20A and the currents output from the two electrode layers 224C (234C), 224D (234D) of the second sensitive part 22 of the photoelectric conversion element 20A.

The calculator 40 also calculates and detects the XY position (coordinates) of the incident light on the light receiving surface of the photoelectric conversion element 20A based on a distribution and ratio of the currents output from the nine electrode layers 223A (233A) and the nine electrode layers 223B (233B) of the first sensitive part 21 of the photoelectric conversion element 20A.

The calculator 40 also refers to the table stored in the storage 30 and obtains and detects the spot size of the incident light on the light receiving surface of the photoelectric conversion element 20A corresponding to the total amount of the currents output from all the electrode layers 223A (233A), 223B (233B), 224C (234C), 224D (234D) of the photoelectric conversion element 20A (i.e. the intensity (total amount) of the incident light on the photoelectric conversion element 20A) and the sum of the currents output from the electrode layers 223A (233A) and electrode layers 223B (233B) of the first sensitive part 21 of the photoelectric conversion element 20A (i.e. the intensity of the incident light on one high-sensitive part 21 of the photoelectric conversion element 20A) at the maximum current point shown in FIG. 7A, and the position (i.e. a distance in the Z direction) of the subject in the Z direction (depth).

If, for example, the XY position (coordinates) of the center of the photoelectric conversion element 20A relative to the XY position (coordinates) of the center of an optical lens 50 is known in advance, the calculator 40 obtains an incident direction of the incident light from the XY position (coordinates) of the center of an optical lens 50 and the XY position (coordinates) of the incident light on the light receiving surface of the photoelectric conversion element 20A, and detects the three-dimensional position of the subject from the obtained incident direction of the incident light and the position (i.e. a distance in the Z direction) in the Z direction (depth).

The photoelectric conversion element 20A is provided with a plurality of pairs of first electrodes 223A (233A), 223B (233B) for outputting currents from the aforementioned plurality of first parts 21, and the plurality of second electrodes 224C (234C), 224D (234D) for outputting currents from the aforementioned second sensitive part 22, and the pairs of the first electrodes 223A (233A), 223B (233B) in each of the plurality of first sensitive parts 21 are separately arranged on two sides of the photoelectric conversion element 20A in the longitudinal direction of the strip-like pattern of the first sensitive region, whereas the plurality of second electrodes 224C (234C), 224D (234D) are separately arranged on the other two sides of the photoelectric conversion element 20A in a direction intersecting the longitudinal direction of the strip-like pattern of the first sensitive region. Thus, the principal surface of the photoelectric conversion element 20A is an XY plane, a direction orthogonal to the XY plane is a Z direction, and the aforementioned predetermined direction is an X direction, in which case the calculator 40 can obtain the position of a light source of incident light in the X direction based on a maximum point of the distribution of the output current An+Bn of the plurality of first sensitive parts 21 of the photoelectric conversion element 20A, or a ratio between an output current C1 of the second electrodes 224C (234C) on one of the other two sides of the photoelectric conversion element 20A, and an output current D1 of the second electrodes 224D (234D) on the other side, obtain the position of the light source of the incident light in the Y direction based on a ratio between the output current An of the first electrodes 223A (233A) on one of the two sides of the photoelectric conversion element 20A, and the output current Bn of the first electrodes 223B (233B) on the other side, and obtain the position of the light source of the incident light in the Z direction based on the spot size of the incident light in the photoelectric conversion element 20A.

According to the photoelectric conversion device 1A of this embodiment, the plurality of first sensitive parts 21 are arrayed on the light receiving surface of the photoelectric conversion element 20A, and a detection region can therefore be substantially enlarged.

Modification of Second Embodiment

Although the passivation layer 230, the n-type semiconductor layer 231 and the transparent electrode layer 232 successively formed on the back surface side of the photoelectric conversion element 20A are separated between the first sensitive part 21 and the second sensitive part 22 in the form illustrated in this embodiment, there is no limitation to this. The photoelectric conversion element 20A may be formed such that, on at least one of the light receiving surface side and the back surface side, the passivation layer, the conductivity-type semiconductor layer and the transparent electrode layer of the first sensitive part 21 are separated from the passivation layer, the conductivity type semiconductor layer and the transparent electrode layer of the second sensitive part 22. In other words, strip-like pattern(s) in the first sensitive part 21 (first sensitive region) may be formed on at least one of the light receiving surface side and the back surface side of the photoelectric conversion element 20A.

For example, contrary to the aforementioned embodiment, strip-like pattern(s) of the first sensitive part 21 may be formed on the light receiving surface side of the photoelectric conversion element 20A. More specifically, the passivation layer 230, the n-type semiconductor layer 231 and the transparent electrode layer 232 on the back surface side of the photoelectric conversion element 20A may continue between the first sensitive part 21 and the second sensitive part 22, and the passivation layer 220, the p-type semiconductor layer 221 and the transparent electrode layer 222 on the light receiving surface side of the photoelectric conversion element 20A may be separated between the first sensitive part 21 and the second sensitive part 22. For example, strip-like pattern(s) of the first sensitive part 21 may be formed on the light receiving surface side and the back surface side of the photoelectric conversion element 20A. More specifically, the passivation layer 220, the p-type semiconductor layer 221 and the transparent electrode layer 222 on the light receiving surface side of the photoelectric conversion element 20A may be separated between the first sensitive part 21 and the second sensitive part 22, and the passivation layer 230, the n-type semiconductor layer 231 and the transparent electrode layer 232 on the back surface side of the photoelectric conversion element 20A may also be separated between the first sensitive part 21 and the second sensitive part 22. In this case, optical characteristics (e.g. reflection characteristic) on the light receiving surface may be separately adjusted.

A transparent electrode layer may be formed in a part between the first sensitive part 21 and the second sensitive part 22 of the photoelectric conversion element 20A. Particularly, if the transparent electrode layer is formed when the passivation layer 220, the p-type semiconductor layer 221 and the transparent electrode layer 222 on the light receiving surface side of the photoelectric conversion element 20A are separated, optical characteristics (e.g. reflection characteristic) on the light receiving surface side are improved.

Although the embodiments of the present disclosure have been described above, the present disclosure is not limited to the above embodiments and various modifications can be made. For example, although the hetero-junction type photoelectric conversion elements 20, 20A have been illustrated as shown in FIG. 2 in the above embodiments, the features of the present disclosure are not limited to hetero-junction type photoelectric conversion elements and are applicable to various photoelectric conversion elements such as homo-junction type photoelectric conversion elements.

In the above embodiments, p-type semiconductor layers have been illustrated as the conductivity type semiconductor layers 221 on the light receiving surface side and n-type semiconductor layers have been illustrated as the conductivity type semiconductor layers 231 on the back surface side. However, the conductivity type semiconductor layer 221 on the light receiving surface side may be an n-type semiconductor layer in which an amorphous silicon material is doped with an n-type dopant (e.g. phosphorus (P) described above), and the conductivity type semiconductor layer 231 on the back surface side may be a p-type semiconductor layer in which an amorphous silicon material is doped with a p-type dopant (e.g. boron (B) described above).

Although an n-type semiconductor substrate has been illustrated as the semiconductor substrate 210 in the above embodiments, the semiconductor substrate 210 may be a p-type semiconductor substrate in which a crystalline silicon material is doped with a p-type dopant (e.g. boron (B) described above).

Although the photoelectric conversion elements each including the crystalline silicon substrate have been illustrated in the above embodiments, there is no limitation to this. For example, the photoelectric conversion element may include a gallium arsenide (GaAs) substrate.

What is claimed is:

1. A photoelectric conversion element including a photoelectric conversion substrate having first and second principal surfaces, the photoelectric conversion substrate comprising a plurality of first sensitive parts arrayed in a predetermined direction and a second sensitive part, wherein
    each of the plurality of first sensitive parts defines a respective one of a plurality of first sensitive regions on the first principal surface and the second sensitive part defines a second sensitive region on the first principal surface,
    each of the first sensitive regions is configured to receive at least a portion of incident light incident on the first principal surface in an irradiation region, and
    each of the first sensitive regions forms a respective pattern such that a respective ratio of its respective area in the irradiation region to a combined area of all other of the first sensitive regions in the irradiation region and an area of the second sensitive region in the irradiation region decreases as a size of the irradiation region increases.

2. The photoelectric conversion element according to claim 1, wherein
    each of the plurality of first sensitive regions forms a strip-like pattern on the first principal surface, and
    the predetermined direction is a direction intersecting a longitudinal direction of the strip-like pattern.

3. The photoelectric conversion element according to claim 2, wherein
    the plurality of first sensitive parts and the second sensitive part have different photoelectric conversion characteristics.

4. The photoelectric conversion element according to claim 1, wherein
    the plurality of first sensitive parts and the second sensitive part have different photoelectric conversion characteristics.

5. The photoelectric conversion element according to claim 4, wherein
    the photoelectric conversion substrate contains a single-crystal silicon material, and
    the photoelectric conversion element further comprises
        a first conductivity type semiconductor layer formed at one of the first and second principal surfaces of the photoelectric conversion substrate, and
        a second conductivity type semiconductor layer formed at an other of the first and second principal surfaces of the photoelectric conversion substrate.

6. The photoelectric conversion element according to claim 5, wherein
    the second sensitive part has a photoelectric conversion characteristic lower than that of the plurality of first sensitive parts,
    the photoelectric conversion element further includes passivation layers formed on the first and second principal surfaces in each of the plurality of first sensitive parts, such that the passivation layers are absent from at least one of the first and second principal surfaces in the second sensitive part.

7. The photoelectric conversion element according to claim 6, wherein
    in the photoelectric conversion element, the plurality of first sensitive parts further define the first sensitive regions on the second principal surface and the second sensitive part further defines the second sensitive region on the second principal surface, and
    the photoelectric conversion element further comprises
        a first one of the passivation layers, the first conductivity type semiconductor layer and a first transparent electrode layer are successively formed at the first principal surface in the first sensitive regions and the second sensitive region, and
        a second one of the passivation layers, the second conductivity type semiconductor layer and a second transparent electrode layer are successively formed at the second principal surface in the first sensitive regions, such that the second one of the passivation layers, the second conductivity type semiconductor layer and the second transparent electrode layer are absent from the second sensitive region on the second principal surface.

8. The photoelectric conversion element according to claim 6, wherein
    in the photoelectric conversion element, the plurality of first sensitive parts further define the first sensitive regions on the second principal surface and the second sensitive part further defines the second sensitive region on the second principal surface, and
    the photoelectric conversion element further comprises
        a second one of the passivation layers, the second conductivity type semiconductor layer and a second transparent electrode layer successively formed at the second principal surface in the plurality of first sensitive regions and the second sensitive region, and a first one of the passivation layers, the first conductivity type semiconductor layer and a first transparent electrode layer successively formed at the first principal surface in the plurality of first sensitive regions, such that the first one of the passivation layers, the first conductivity type semiconductor layer and the first transparent electrode layer are absent from the second sensitive region on the first principal surface.

9. The photoelectric conversion element according to claim 1, wherein
the plurality of first sensitive parts are separated from the second sensitive part.

10. The photoelectric conversion element according to claim 9, wherein
the photoelectric conversion substrate contains a single-crystal silicon material, and
the photoelectric conversion element further comprises
a first conductivity type semiconductor layer formed at one of the first and second principal surfaces of the photoelectric conversion substrate, and
a second conductivity type semiconductor layer formed at an other one of the first and second principal surfaces of the photoelectric conversion substrate.

11. The photoelectric conversion element according to claim 10, wherein
in the photoelectric conversion element, the plurality of first sensitive parts further define the first sensitive regions on the second principal surface and the second sensitive part further defines the second sensitive region on the second principal surface, and
at least one of the first and second principal surfaces of the photoelectric conversion substrate, the first sensitive regions are separated from the second sensitive region.

12. The photoelectric conversion element according to claim 11, wherein
the photoelectric conversion element further comprises
a first passivation layer, the first conductivity type semiconductor layer and a first transparent electrode layer successively formed at the first principal surface and continue between the first sensitive regions and the second sensitive region, and
a second passivation layer, the second conductivity type semiconductor layer and a second transparent electrode layer successively formed at the second principal surface, such that the second principal surface has separations between the first sensitive regions and the second sensitive region.

13. The photoelectric conversion element according to claim 11, wherein
the photoelectric conversion element further comprises
a first passivation layer, the first conductivity type semiconductor layer and a first transparent electrode layer successively formed at the first principal surfaces, such that the first principal surface has separations between the first sensitive region and the second sensitive region, and
a second passivation layer, the second conductivity type semiconductor layer and a second transparent electrode layer successively formed at the second principal surface and continue between the first sensitive region and the second sensitive region.

14. A photoelectric conversion device comprising the photoelectric conversion element according to claim 9.

15. The photoelectric conversion device according to claim 14, further comprising
an optical lens arranged on an upstream side of the incident light, and
wherein the photoelectric conversion element is arranged on a downstream side of the incident light.

16. The photoelectric conversion device according to claim 14, further comprising
a calculator configured to calculate a spot size of the incident light on the photoelectric conversion element based on output currents of the plurality of first sensitive parts and an output current of the second sensitive part in the photoelectric conversion element, and an output current of one of the first sensitive parts having a maximum output current among the plurality of first sensitive parts.

17. The photoelectric conversion device according to claim 16, wherein
each of the first sensitive region of the photoelectric conversion element forms at least one strip-like pattern on the first principal surface, and
the photoelectric conversion element includes
a plurality of pairs of first electrodes that output first currents from the plurality of first sensitive parts, and
a plurality of second electrodes that output second currents from the second sensitive parts,
the pairs of first electrodes in each of the plurality of first sensitive parts are separately arranged on two sides of the photoelectric conversion element in a longitudinal direction of the strip-like pattern of the first sensitive regions, and
the plurality of second electrodes are separately arranged on other two sides of the photoelectric conversion element in a direction intersecting a longitudinal direction of the strip-like pattern of the first sensitive regions.

18. A photoelectric conversion device comprising:
an other photoelectric conversion element arranged on an upstream side of the incident light; and
wherein the photoelectric conversion element according to claim 1 is arranged on a downstream side of the incident light.

19. The photoelectric conversion device according to claim 18, further comprising
a calculator configured to calculate a spot size of the incident light on the photoelectric conversion element based on an output current of the other photoelectric conversion element and an output current of one of the first sensitive parts having a maximum output current among the plurality of first sensitive parts of the photoelectric conversion element.

20. The photoelectric conversion device according to claim 19, wherein
each of the first sensitive region of the photoelectric conversion element forms at least one strip-like pattern on the first principal surface, and
the photoelectric conversion element includes
a plurality of pairs of electrodes that output currents from the plurality of first sensitive parts, and
a pair of the electrodes in each of the plurality of first sensitive parts are separately arranged on two sides of the photoelectric conversion element in a longitudinal direction of a strip-like pattern of the first sensitive region.

* * * * *